(12) United States Patent
Inoue et al.

(10) Patent No.: US 11,251,310 B2
(45) Date of Patent: Feb. 15, 2022

(54) OXIDE SEMICONDUCTOR FILM, ELECTRONIC DEVICE COMPRISING THIN FILM TRANSISTOR, OXIDE SINTERED BODY AND SPUTTERING TARGET

(71) Applicant: IDEMITSU KOSAN CO., LTD., Tokyo (JP)

(72) Inventors: Kazuyoshi Inoue, Sodegaura (JP); Masatoshi Shibata, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 16/485,381

(22) PCT Filed: Feb. 15, 2018

(86) PCT No.: PCT/JP2018/005245
§ 371 (c)(1),
(2) Date: Aug. 12, 2019

(87) PCT Pub. No.: WO2018/155301
PCT Pub. Date: Aug. 30, 2018

(65) Prior Publication Data
US 2019/0378933 A1 Dec. 12, 2019

(30) Foreign Application Priority Data
Feb. 22, 2017 (JP) .............................. JP2017-031460

(51) Int. Cl.
*H01L 21/363* (2006.01)
*H01L 29/78* (2006.01)
(Continued)

(52) U.S. Cl.
CPC ........ *H01L 29/78693* (2013.01); *C04B 35/01* (2013.01); *C04B 35/6261* (2013.01);
(Continued)

(58) Field of Classification Search
CPC .............. H01L 29/78693; H01L 29/24; H01L 29/66969; H01L 29/7869; H01L 29/267;
(Continued)

(56) References Cited

U.S. PATENT DOCUMENTS 7,309,405 B2 * 12/2007 Cho ...................... C23C 14/086
204/192.11
2008/0308774 A1   12/2008 Inoue et al.
(Continued)

FOREIGN PATENT DOCUMENTS

JP   H04-272612 A   9/1992
JP   2010030824 A * 2/2010
(Continued)

OTHER PUBLICATIONS

International Preliminary Report on Patentability dated Aug. 27, 2019 for corresponding Application No. PCT/JP2018/005245 (10 pages).
(Continued)

*Primary Examiner* — Daniel J. Schleis
*Assistant Examiner* — Kevin C T Li
(74) *Attorney, Agent, or Firm* — Foley & Lardner LLP

(57) ABSTRACT

An oxide semiconductor film contains In, Ga, and Sn at respective atomic ratios of $0.01 \leq Ga/(In+Ga+Sn) \leq 0.30$ ... (1), $0.01 \leq Sn/(In+Ga+Sn) \leq 0.40$ ... (2), and $0.55 \leq In/(In+Ga+Sn) \leq 0.98$ ... (3), and a rare-earth element X at an atomic ratio of $0.03 \leq X/(In+Ga+Sn+X) \leq 0.25$ ... (4).

15 Claims, 18 Drawing Sheets

(51) Int. Cl.
*H01L 29/80* (2006.01)
*C23C 14/08* (2006.01)
*C23C 14/34* (2006.01)
*C04B 35/01* (2006.01)
*H01L 29/786* (2006.01)
*C04B 35/626* (2006.01)
*C04B 35/64* (2006.01)
*H01L 21/02* (2006.01)
*H01L 29/24* (2006.01)
*H01L 29/66* (2006.01)

(52) U.S. Cl.
CPC ............ *C04B 35/64* (2013.01); *C23C 14/08* (2013.01); *C23C 14/34* (2013.01); *H01L 21/02565* (2013.01); *H01L 21/02631* (2013.01); *H01L 29/24* (2013.01); *H01L 29/66969* (2013.01); *H01L 29/7869* (2013.01); *C04B 2235/3224* (2013.01); *C04B 2235/3225* (2013.01); *C04B 2235/3286* (2013.01); *C04B 2235/3293* (2013.01); *C04B 2235/604* (2013.01); *C04B 2235/6567* (2013.01)

(58) Field of Classification Search
CPC ................ H01L 29/26; H01L 29/7391; H01L 21/02565; H01L 21/02631; H01L 21/02381; C04B 35/01; C04B 35/6261; C04B 35/64; C04B 2235/3224; C04B 2235/3225; C04B 2235/3286; C04B 2235/3293; C04B 2235/604; C04B 2235/6567; C04B 2235/3227; C04B 2235/80; C04B 2235/77; C04B 2235/6562; C04B 35/457; C23C 14/08; C23C 14/34; C23C 14/3414
See application file for complete search history.

(56) References Cited

U.S. PATENT DOCUMENTS

| | | |
|---|---|---|
| 2011/0084280 A1 | 4/2011 | Nakayama et al. |
| 2011/0102722 A1 | 5/2011 | Kang et al. |
| 2012/0313057 A1 | 12/2012 | Itose et al. |
| 2013/0320336 A1 | 12/2013 | Ha et al. |
| 2016/0316159 A1 | 10/2016 | Yoneda |
| 2016/0329353 A1 | 11/2016 | Goto et al. |

FOREIGN PATENT DOCUMENTS

| | | | |
|---|---|---|---|
| JP | 2011-094232 A | | 5/2011 |
| JP | 2011-174134 A | | 9/2011 |
| JP | 2013-249537 A | | 12/2013 |
| JP | 2014-111818 A | | 6/2014 |
| JP | 2016-026268 A | | 2/2016 |
| JP | 2016-208515 A | | 12/2016 |
| JP | 2017031460 A | * | 2/2017 |
| WO | WO-03/014409 A1 | | 2/2003 |
| WO | WO-2009/128424 A1 | | 10/2009 |
| WO | WO-2015/108110 A1 | | 7/2015 |

OTHER PUBLICATIONS

International Searching Authority, "International Search Report," issued in connection with International Patent Application No. PCT/JP2018/005245, dated May 1, 2018.

International Searching Authority, "Written Opinion," issued in connection with International Patent Application No. PCT/JP2018/005245, dated May 1, 2018.

Rickert et al., "Site Dependency of the High Conductivity of $Ga_2In_6Sn_2O_{16}$: The Role of the 7-Coordinate Site," vol. 27, No. 23, Chemistry of Materials, Nov. 11, 2015, pp. 8084-8093.

* cited by examiner

OXIDE SEMICONDUCTOR FILM, ELECTRONIC DEVICE COMPRISING THIN FILM TRANSISTOR, OXIDE SINTERED BODY AND SPUTTERING TARGET

RELATED APPLICATIONS

The present application claims priority under 37 U.S.C. § 371 to International Patent Application No. PCT/JP2018/005245, filed Feb. 15, 2018, which claims priority to and the benefit of Japanese Patent Application No. 2017-031460, filed on Feb. 22, 2017. The contents of these applications are hereby incorporated by reference in their entireties.

TECHNICAL FIELD

The present invention relates to an oxide semiconductor film, a sputtering target capable of being used for production of an oxide semiconductor film of a TFT (Thin-Film Transistor) and the like, and a sintered oxide as a material of the sputtering target.

BACKGROUND ART

Amorphous oxide semiconductor usable for a thin-film transistor has higher carrier mobility than general-purpose amorphous silicon (a-Si) and a large optical band gap, and can form a film at a low temperature. Accordingly, the use of the amorphous oxide semiconductor is expected in the field of next-generation display devices requiring high-resolution and high-speed large-size image display, and a resin substrate with low heat resistance.

The oxide semiconductor (film) is suitably formed through a sputtering process, in which a sputtering target is sputtered. This is because a thin film formed through the sputtering process is more excellent in terms of in-plane uniformity (e.g. composition uniformity in a film plane direction (i.e. within a film plane) and even film thickness) than a thin film formed through ion-plating process, vacuum deposition process or electron beam deposition process, allowing the formation of the thin film with the same composition as that of the sputtering target.

Patent Literature 1 discloses an example of an oxide semiconductor film formed of $In_2O_3$ added with $Ga_2O_3$ and $SnO_2$. However, the control of carriers (i.e. reduction in carrier concentration) of this film after film formation is so difficult that the film sometimes does not serve as a semiconductor after an interlayer insulating film or the like is formed on the film by CVD or the like.

Patent Literature 2 discloses a transistor laminated with an oxide semiconductor film formed of $In_2O_3$ added with $Ga_2O_3$ and $SnO_2$ and an oxide semiconductor film formed of $In_2O_3$ added with $Ga_2O_3$, $SnO_2$, and ZnO, and a sputtering target.

Patent Literatures 3 to 6 each disclose a method of producing a transparent conductive film formed of $In_2O_3$, $Ga_2O_3$, and $SnO_2$, and an example of a sputtering target.

Meanwhile, there exists strong demand for higher-quality TFT, and for a material exhibiting high carrier mobility and small change in properties during CVD process and the like.

CITATION LIST

Patent Literature(s)

Patent Literature 1 JP 2013-249537 A
Patent Literature 2 WO 2015-108110
Patent Literature 3 JP 2011-94232 A
Patent Literature 4 JP 4-272612 A
Patent Literature 5 WO 2003-014409
Patent Literature 6 WO 2009-128424

SUMMARY OF THE INVENTION

Problem(s) to be Solved by the Invention

An object of the invention is to provide a new oxide semiconductor film made of a new oxide system.

Another object of the invention is to provide an oxide semiconductor film exhibiting excellent performance when being used for a TFT, a sputtering target capable of forming the oxide semiconductor film, and a sintered oxide as a material of the sputtering target.

Means for Solving the Problem(s)

According to some aspects of the invention, an oxide semiconductor film, a thin-film transistor, a sintered oxide, and a sputtering target are provided.

An oxide semiconductor film according to an aspect of the invention contains In, Ga, and Sn at respective atomic ratios of:

$$0.01 \le Ga/(In+Ga+Sn) \le 0.30 \tag{1};$$

$$0.01 \le Sn/(In+Ga+Sn) \le 0.40 \tag{2); and}$$

$$0.55 \le In/(In+Ga+Sn) \le 0.98 \tag{3), and}$$

a rare-earth element X at an atomic ratio of $$0.03 \le X/(In+Ga+Sn+X) \le 0.25 \tag{4}.$$

In the oxide semiconductor film according to the above aspect of the invention, the rare-earth element X is preferably at least one rare-earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

In the oxide semiconductor film according to the above aspect of the invention, the rare-earth element X is preferably at least one rare-earth element selected from the group consisting of yttrium (Y), lanthanum (La), neodymium (Nd), and samarium (Sm).

A thin-film transistor according to another aspect of the invention uses the oxide semiconductor film according to the above aspect of the invention.

An sintered oxide according to still another aspect of the invention contains In, Ga, and Sn at respective atomic ratios of:

$$0.01 \le Ga/(In+Ga+Sn) \le 0.30 \tag{5};$$

$$0.01 \le Sn/(In+Ga+Sn) \le 0.40 \tag{6); and}$$

$$0.55 \le In/(In+Ga+Sn) \le 0.98 \tag{7), and}$$

a rare-earth element X at an atomic ratio of $$0.03 \le X/(In+Ga+Sn+X) \le 0.25 \tag{8}.$$

In the sintered oxide according to the above aspect of the invention, the rare-earth element X is preferably at least one rare-earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

In the sintered oxide according to the above aspect of the invention, the rare-earth element X is preferably at least one rare-earth element selected from the group consisting of yttrium (Y), lanthanum (La), neodymium (Nd), and samarium (Sm).

In the sintered oxide according to the above aspect of the invention, the sintered oxide preferably contains a main component in a form of $In_2O_3$ crystal, and the sintered oxide preferably further contains at least one of $X_2Sn_2O_7$ crystal and $X_3Ga_5O_{12}$ crystal, X representing the rare-earth element.

In the sintered oxide according to the above aspect of the invention, a relative density of the sintered oxide is preferably 95% or more.

In the sintered oxide according to the above aspect of the invention, a bulk resistivity of the sintered oxide is preferably 30 mΩcm or less.

A sputtering target according to a further aspect of the invention includes: the sintered oxide according to the above aspect of the invention; and a backing plate.

An electronic device according to a still further aspect of the invention includes the thin-film transistor according to the above aspect of the invention.

The above aspect of the invention provides a new oxide semiconductor film made of a new oxide system.

Further, the above aspects of the invention provide an oxide semiconductor film exhibiting excellent performance when being used for a TFT, a sputtering target capable of forming the oxide semiconductor film, and a sintered oxide as a material of the sputtering target.

BRIEF DESCRIPTION OF DRAWING(S)

DESCRIPTION OF EMBODIMENT(S)

Background of Invention

Figure 1:
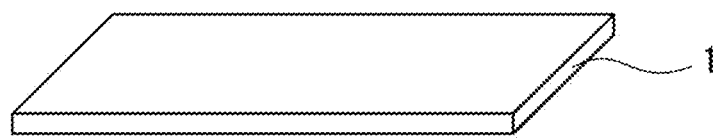
FIG. 1 is a perspective view showing a shape of a target according to an exemplary embodiment of the invention.

Minute line-shaped cracks called hairline cracks are sometimes caused on a typical sputtering target at the time of sputtering using the sputtering target made of a sintered oxide produced by sintering indium oxide ($In_2O_3$), gallium oxide ($Ga_2O_3$), and tin oxide ($SnO_2$). The hairline cracks may cause abnormal electrical discharge at the time of sputtering to generate a foreign body (so-called nodule), resulting in reduction in yield rate and deterioration in performance of a product.

Though the cause of the hairline cracks is not clearly known, it is speculated that the hairline cracks occur due to internal stress by a difference in thermal expansion coefficients, which is caused when heat is applied to the sputtering target in one direction at the time of sputtering, between crystalline phases of the compounds such as $Ga_3In_5Sn_2O_{16}$, $Ga_2In_6Sn_2O_{16}$, and $Ga_3InSn_5O_{16}$ present in the sputtering target.

In order to solve the above problems, the inventors have found that the formation of the compounds such as $Ga_3In_5Sn_2O_{16}$, $Ga_2In_6Sn_2O_{16}$, and $Ga_3InSn_5O_{16}$ can be reduced by sintering a mixture of indium oxide ($In_2O_3$), gallium oxide ($Ga_2O_3$), and tin oxide ($SnO_2$) added with an oxide $X_2O_3$ of a rare-earth element X (Y, La, Nd, Sm, Eu, Gd, Tb, Dy, Ho, Er, Tm, Yb, Lu) such as $Y_2O_3$, $La_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$ and $Lu_2O_3$.

It is found that the sputtering target of the above composition is free from internal stress, causes no hairline cracks and the like, and can provide an oxide semiconductor with a stable composition.

Sintered Oxide

A sintered oxide according to an exemplary embodiment of the invention (sometimes simply referred to as the present sintered body hereinafter) contains In, Ga, and Sn at atomic ratios of:

$$0.01 \leq Ga/(In+Ga+Sn) \leq 0.30 \quad (5)$$

$$0.01 \leq Sn/(In+Ga+Sn) \leq 0.40 \quad (6)$$

$$0.55 \leq In/(In+Ga+Sn) \leq 0.98 \quad (7)$$

and a rare-earth element X at an atomic ratio of:

$$0.03 \leq X/(In+Ga+Sn+X) \leq 0.25 \quad (8)$$

The present sintered body is produced by sintering a base material including indium oxide, gallium oxide, and tin oxide added with a crystallization inhibitor of a rare-earth element oxide.

The "rare-earth element" herein, which is also referred to as a rare-earth metal element, is a generic name for scandium (Sc), yttrium (Y), and lanthanoid elements, which are categorized in group 3 elements in the periodic table. The "lanthanoid element" herein includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). The same applies to the description below.

In the invention, at least one of the rare-earth elements selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) is preferably usable, more preferably selected from the group consisting of yttrium (Y), samarium (Sm), and ytterbium (Yb).

The rare-earth element X is further preferably at least one element selected from the group consisting of yttrium (Y), lanthanum (La), neodymium (Nd), and samarium (Sm).

The rare-earth element, which has an ionic radius larger than ionic radii of In (indium) ions, Ga (gallium) ions, and Sn (tin) ions, does not form a solid solution with $Ga_3In_5Sn_2O_{16}$, $Ga_2In_6Sn_2O_{16}$, and $Ga_3InSn_5O_{16}$ compounds and easily reacts with Sn (tin) and Ga (gallium), is believed to form $X_2Sn_2O_7$ and $X_3Ga_5O_{12}$ compounds (X: rare-earth element) to serve as the crystallization inhibitor for the $Ga_3In_5Sn_2O_{16}$, $Ga_2In_6Sn_2O_{16}$, and $Ga_3InSn_5O_{16}$ compounds.

Specifically, $In_2O_3$, $Ga_2O_3$, and $SnO_2$ are mixed so that atomic ratios of In, Ga, and Sn are within the ranges of:

$$0.01 \leq Ga/(In+Ga+Sn) \leq 0.30 \quad (5)$$

$$0.01 \leq Sn/(In+Ga+Sn) \leq 0.40 \quad (6)$$

$$0.55 \leq In/(In+Ga+Sn) \leq 0.98 \quad (7)$$

and $X_2O_3$ (crystallization inhibitor) is added and mixed so that an atomic ratio of the rare-earth element X is within the range of:

$$0.03 \leq X/(In+Ga+Sn+X) \leq 0.25 \quad (8)$$

to prepare a material, which is sintered to form the sintered oxide.

The crystallization inhibitor ($X_2O_3$) added before $In_2O_3$, $Ga_2O_3$, and $SnO_2$ are sintered allows a formation of a sintered body, whose main component is not a $Ga_3InSn_5O_{16}$ compound or a $Ga_2In_6Sn_2O_{16}$ compound (i.e. typical main component in sintering $In_2O_3$, $Ga_2O_3$, and $SnO_2$) and which contains $In_2O_3$ crystals, and $X_2Sn_2O_7$ crystals and/or $X_3Ga_5O_{12}$ crystals.

A sputtering target according to an aspect of the invention (sometimes referred to as the present target hereinafter) includes the above sintered oxide, and a backing plate.

The present sintered body is ground and polished into a plate to prepare a sputtering target material, which is bonded to a metallic backing plate using a low-melting-point metal (e.g. indium) to provide the sputtering target as a component of a sputtering apparatus.

The sintered body in the sputtering target including the present sintered body and the backing plate will be referred to as "the present target material" hereinafter.

The present sintered body (target material), which is produced by adding the crystallization inhibitor in a form of $X_2O_3$ at a predetermined ratio before being sintered, reduces the formation of compounds such as $Ga_3In_5Sn_2O_{16}$, $Ga_2In_6Sn_2O_{16}$, and $Ga_3InSn_5O_{16}$. These compounds are believed to cause an internal stress at the time of sputtering to produce hairline cracks.

With the use of the present target material, the hairline cracks at the time of sputtering and consequent abnormal electrical discharge, which is a cause of a foreign body called nodule, can be prevented.

Though it is preferable for the present sintered body (target material) not to contain $Ga_3InSn_5O_{16}$ compound and $Ga_2In_6Sn_2O_{16}$ compound, these compounds may be present as long as these compounds in total do not account for the main component of the sintered body (i.e. 50 mass % or less).

It is preferable for the sintered body according to an exemplary embodiment not to contain one or both of $Ga_3InSn_5O_{16}$ compound and $Ga_2In_6Sn_2O_{16}$ compound. Without these compounds, a sintered body (target material) free of hairline cracks at the time of sputtering can be obtained.

It is preferable for the sintered body according to an exemplary embodiment to contain a main component in a form of $In_2O_3$ crystal and one or both of $X_2Sn_2O_7$ and $X_2SnO_7$ crystals (X: the rare-earth element).

Herein, the phrase "main component in a form of $In_2O_3$ crystal" means that the $In_2O_3$ crystal accounts for more than 50 mass %, more preferably 55 mass % or more, further preferably 60 mass % or more of all the oxides in the sintered body.

Hereinafter, the term "main component" refers to a component in a sintered body that accounts for more than 50 mass % of all the oxides in the sintered body.

The main component in a form of $In_2O_3$ crystal and additional component of $X_2Sn_2O_7$ crystal can provide a sintered body that is free of $Ga_3InSn_5O_{16}$ compound and/or $Ga_2In_6Sn_2O_{16}$ compound, which are main component(s) in a sintered body without being added with $X_2O_3$. Thus, hairline cracks and the like can be prevented at the time of sputtering.

In the sintered body according to another exemplary embodiment, it is preferable for a mass ratio of $In_2O_3$ and $X_2Sn_2O_7$ measured in accordance with X-ray analysis is $In_2O_3 > X_2Sn_2O_7$. When the content of $In_2O_3$ is smaller than the content of $X_2Sn_2O_7$, bulk resistivity of the sintered body (target material) sometimes becomes so large that abnormal electrical discharge and/or arc discharge may occur at the time of sputtering. In this case, a yield rate in the production process of TFT may be lowered and/or performance of TFT may be deteriorated. When $In_2O_3>X_2Sn_2O_7$, a target material capable of reducing abnormal electrical discharge and the like can be provided.

Gallium oxide is effective in reducing occurrence of oxygen vacancy and increasing a band gap in a resultant oxide semiconductor film. A Ga ratio [Ga/(In+Ga+Sn) (atomic ratio)] is preferably 0.01≤Ga/(In+Ga+Sn)≤0.30. When the Ga ratio is less than 0.01, the oxygen vacancy is hardly reduced, thereby possibly failing to form the semiconductor film. When the Ga ratio is more than 0.30, the resultant film may become an insulation film due to elimination of the oxygen vacancy. Further, the hairline cracks and the like may occur when the sintered body is used as a target.

More preferably, 0.02≤Ga/(In+Ga+Sn)≤0.27, further preferably, 0.03≤Ga/(In+Ga+Sn)≤0.23.

Tin oxide is chemically resistant and, as can be understood as a usage in an electro-conductive film, is believed to hardly affect carrier mobility in the semiconductor film. Accordingly, the Sn ratio [Sn/(In+Ga+Sn) (atomic ratio)] is preferably 0.01≤Sn/(In+Ga+Sn)≤0.40. When the Sn ratio is less than 0.01, the chemical resistance may not be exhibited. When the Sn ratio is more than 0.40, the chemical resistance may be too high to etch the resultant semiconductor film to form an island(s) of the semiconductor film. More preferably, 0.02≤Sn/(In+Ga+Sn)≤0.35, further preferably, 0.03≤Sn/(In+Ga+Sn)≤0.30.

Indium oxide ensures the carrier mobility in the semiconductor film. The In ratio [In/(In+Ga+Sn) (atomic ratio)] is preferably 0.55≤In/(In+Ga+Sn)≤0.98. When the In ratio is less than 0.55, the carrier mobility may be lowered. Further, the hairline cracks and the like may occur when the sintered body is used as a target.

The In ratio of more than 0.98 may cause crystallization or too much oxygen vacancy to form a semiconductor film (i.e. the resultant film may become a conductor). More preferably, 0.60≤In/(In+Ga+Sn)≤0.96, further preferably, 0.60≤In/(In+Ga+Sn)≤0.94.

Without the rare-earth element oxide in the base material, the main component of the crystalline phase in the resultant sintered body would be $Ga_3InSn_5O_{16}$ compound and/or $Ga_2In_6Sn_2O_{16}$ compound. By the addition of the rare-earth element oxide, a sintered body (target material) whose main component is $In_2O_3$ crystal and $Z_2Sn_2O_7$ crystal can be produced. Thus, the problem (i.e. the hairline cracks and the like) can be solved.

It should be noted that the metal element of the present sintered oxide may consist essentially of In, Ga, Sn, and rare-earth element. The other metal elements may be contained as inevitable impurities.

Examples of the inevitable impurities include alkali metal and alkaline earth metal (Li, Na, K, Rb, Mg, Ca, Sr, Ba and the like). The content of the inevitable impurities is 10 ppm or less, preferably 1 ppm or less, further preferably 100 ppb or less. The concentration of impurities can be measured using ICP or SIMS. Hydrogen and/or nitrogen element may be contained in addition to the alkali metal and alkaline earth metal. In this case, the concentration by SIMS measurement is 5 ppm or less, preferably 1 ppm or less, more preferably 100 ppb or less.

In, Ga, Sn, and rare-earth element may account for, for instance, 70 atom % or more, 80 atom % or more, 90 atom % or more, 95 atom % or more, 98 atom % or more, or 99 atom % or more of all the metal elements in the present sintered oxide.

The present sintered oxide may contain, for instance, Ce (cerium) or the like as a metal element other than In, Ga, Sn, and rare-earth element.

The rare-earth element X in the sintered body (target material) according to an exemplary embodiment of the invention is preferably in an atomic ratio of:

$$0.03 \le X/(In+Ga+Sn+X) \le 0.25 \quad (8)$$

When the ratio is less than 0.03, the generation of the $Ga_3InSn_5O_{16}$ compound and/or $Ga_2In_6Sn_2O_{16}$ compound may not be sufficiently reduced. When the ratio is more than 0.25, the carrier mobility in the thin-film transistor using the resultant oxide semiconductor film is too low to be practical for use. The use of the oxide semiconductor film added with the rare-earth element improves CVD resistance of the thin-film transistor. More preferably, the ratio of X is 0.04≤X/(In+Ga+Sn+X)≤0.20, further preferably, 0.05≤X/(In+Ga+Sn+X)≤0.17.

The sintered body (target material) according to an exemplary embodiment of the invention more preferably contains In, Ga and In at atomic ratios of:

$$0.02 \le Ga/(In+Ga+Sn) \le 0.27 \quad (5A)$$

$$0.02 \le Sn/(In+Ga+Sn) \le 0.35 \quad (6A)$$

$$0.60 \le In/(In+Ga+Sn) \le 0.96 \quad (7A)$$

and the rare-earth element X at an atomic ratio of:

$$0.04 \le X/(In+Ga+Sn+X) \le 0.20 \quad (8A)$$

More preferably, the sintered body (target material) according to an exemplary embodiment of the invention further preferably contains In, Ga and In at atomic ratios of:

$$0.03 \le Ga/(In+Ga+Sn) \le 0.23 \quad (5B)$$

$$0.03 \le Sn/(In+Ga+Sn) \le 0.30 \quad (6B)$$

$$0.60 \le In/(In+Ga+Sn) \le 0.94 \quad (7B)$$

and X at an atomic ratio of:

$$0.05 \le X/(In+Ga+Sn+X) \le 0.17 \quad (8B).$$

A relative density of the sintered body (target material) according to an exemplary embodiment of the invention is 95% or more.

When the relative density of the sintered body (target material) is less than 95%, the hairline cracks or nodules may be caused at the time of sputtering, sometimes deteriorating the performance and reducing the yield rate of the thin-film transistor using the resultant oxide semiconductor film. In addition, the low relative density of the sintered body decreases the density of the resultant film, so that a film-formation temperature in a CVD apparatus has to be lowered in forming a protective insulation film and/or interlayer insulating film on the film using the CVD apparatus, thereby possibly reducing the durability of the film. The relative density of the sintered body (target material) is preferably 97% or more, more preferably 98%, further preferably 99% or more.

The relative density is measurable according to the method described in Examples.

Bulk resistivity of the sintered body according to an exemplary embodiment of the invention is preferably 30 mΩcm or less. When the bulk resistivity is 30 mΩcm or less, occurrence of abnormal electrical discharge, partial discoloration, and occurrence of nodules can be prevented even at a high-power sputtering, thereby stabilizing the sputtering process. The bulk resistivity is more preferably 20 mΩcm or less, further preferably 18 Ωcm or less. The lower limit of the bulk resistivity is usually 0.1 mΩcm, preferably 1 mΩcm.

The bulk resistivity can be measured by, for instance, a four-probe method.

Production Method of Sintered Oxide

The sintered oxide according to an exemplary embodiment of the invention can be produced by performing: mixing step of mixing material powder; molding step of molding the mixed powder to form a molding; and sintering step of sintering the molding.

Examples of the material include indium compounds, gallium compounds, tin compounds, and rare-earth compounds, which are preferably oxides. For instance, indium oxide ($In_2O_3$), gallium oxide ($Ga_2O_3$), and rare-earth oxide are suitably usable.

Though any commercially available indium oxide powder is usable, high-purity (e.g. 4N (0.9999) or more) indium oxide powder is suitable. In place of or in addition to indium oxide, other indium salt such as indium chloride, indium nitrate, and indium acetate is usable.

Though any commercially available gallium oxide powder is usable, high-purity (e.g. 4N (0.9999) or more) gallium oxide powder is preferable. In place of or in addition to gallium oxide, other gallium salt such as gallium chloride, gallium nitrate, and gallium acetate is usable.

Though any commercially available tin oxide powder is usable, high-purity (e.g. 4N (0.9999) or more) tin oxide powder is preferable. In place of or in addition to oxide, other aluminum salt such as aluminum chloride, aluminum nitrate, and aluminum acetate is usable.

Though any commercially available rare-earth oxide powder is usable, high-purity (e.g. 4N (0.9999) or more) rare-earth oxide powder is preferable. The rare-earth power is not necessary a rare-earth oxide.

The material powders are preferably mixed in the atomic ratios according to the formulae (5) to (8).

In the method of mixing the material powders, which is not particularly limited, the material powders are mixed and pulverized at one time or separately in two or more times. Examples of the mixer/pulverizer include known apparatuses such as a ball mill, bead mill, jet mill, and ultrasonic devices.

The material prepared in the mixing step is molded and sintered according to known processes to provide the sintered oxide.

In the molding step, the mixed powder obtained in the mixing step is subjected to, for instance, pressure-forming to form a molding. Through the above step, the material powder is molded into a shape of a product (e.g. a shape suitable for a sputtering target).

Examples of the molding process include metallic molding, die-casting, and injection molding. However, the material powder is preferably molded through CIP (Cold Isostatic Press) or the like in order to obtain a sintered oxide with a high sintering density.

In the molding process, a molding aid such as polyvinyl alcohol, methyl cellulose, polywax, and oleic acid may be used.

In the sintering step, the molding obtained in the molding step is sintered.

The sintering step is performed in an atmospheric pressure, in an oxygen atmosphere or in pressurized oxygen atmosphere, usually in a temperature range from 1200 to 1550 degrees C., for 30 minutes to 360 hours, preferably 8 to 180 hours, more preferably for 12 to 96 hours. When the sintering temperature is less than 1200 degrees C., the density of the target may be not easily increased or too much time may be required in order to sinter the molding. Meanwhile, when the sintering temperature exceeds 1550 degrees C., the material may be partly gasified, so that the composition of the material falls outside the desired range or the furnace may be damaged.

When the sintering time is less than 30 minutes, the density of the target is not easily increased. Meanwhile, the sintering time of more than 360 is not practically available in view of excessive production time and cost. The sintering time within the above range can increase the relative density and lower the bulk resistivity.

Sputtering Target

The sputtering target can be produced using the sintered oxide according to an exemplary embodiment of the invention. Specifically, the sintered oxide is ground and polished, and is bonded to a backing plate to provide the sputtering target.

A bonding rate to the backing plate is preferably 95% or more. The bonding rate can be measured in an X-ray CT.

The sputtering target according to an exemplary embodiment of the invention (referred to as the present target hereinafter) includes the above sintered oxide (referred to as the present sintered oxide hereinafter), and the backing plate. The sputtering target according to the exemplary embodiment of the invention preferably includes the present sintered oxide and, as necessary, a cooler/holder (e.g. the backing plate) provided on the sintered oxide.

The sintered oxide (target material) of the present target is provided by grinding a surface the above-described present sintered oxide. Accordingly, the substance of the target material is the same as the present sintered oxide. The explanation on the present sintered oxide thus directly applies to the target material.

Figure 2:
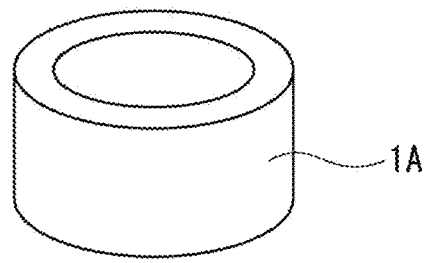
FIG. 2 is a perspective view showing a shape of a target according to an exemplary embodiment of the invention.
Figure 3:
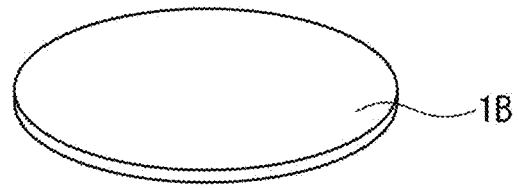
FIG. 3 is a perspective view showing a shape of a target according to an exemplary embodiment of the invention.
Figure 4:
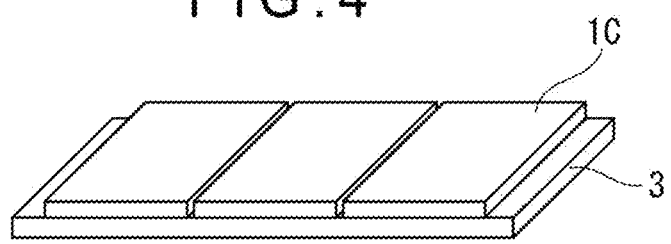
FIG. 4 is a perspective view showing a shape of a target according to an exemplary embodiment of the invention.

The shape of the sintered oxide is not particularly limited. For instance, the sintered oxide may be in a plate as shown in FIG. 1 (item 1) or a hollow cylinder as shown in FIG. 2 (item 1A). When the sintered oxide is plate-shaped, the sintered oxide may be rectangular in a plan view as shown in FIG. 1 (item 1) or circular in a plan view as shown in FIG. 3 (item 1B). The sintered oxide may be a single-piece molding or may be a multiple-division component including a plurality of divided sintered oxides (item 1C) fixed on a backing plate 3 as shown in FIG. 4.

The backing plate 3 is a holder/cooler for the sintered oxide. The backing plate 3 is preferably made of a material with excellent thermal conductivity (e.g. copper).

The sputtering target is produced through, for instance, the following steps.

A step for grinding a surface of the sintered oxide (grinding step).

A step of bonding the sintered oxide on the backing plate (bonding step).

The above steps will be specifically described below.

Grinding Step

In the grinding step, the sintered body is ground into a shape adapted to be attached to a sputtering apparatus.

The surface of the sintered body is often partially highly oxidized or roughened. Further, the sintered body has to be cut into piece(s) of a predetermined size.

The surface of the sintered body is preferably ground for 0.3 mm or more. The ground depth is more preferably 0.5 mm or more, especially preferably 2 mm or more. A part of the sintered body at or near the surface thereof, at which crystal structure is modified, can be removed by grinding 0.3 mm or more.

It is preferable to grind the sintered oxide using, for instance, a surface grinder to form a material whose average surface roughness Ra is 5 μm or less. A sputtering surface of the sputtering target may further be mirror-finished so that the average surface roughness Ra is $1000\times10^{-10}$ m or less. The mirror-finishing (polishing) may be performed using any known polishing technique including mechanical polishing, chemical polishing, and mechanochemical polishing (combination of the mechanical polishing and chemical polishing). For instance, the surface may be polished using a fixed-abrasive-grain polisher (polishing liquid: water) to P2000 or finer grit size, or may be lapped using diamond-paste polishing material after lapping using a loose-abrasive-grain lapping material (polishing material: SiC paste etc.). The polishing method is not limited to the above. Examples of the polishing material include a polishing material with P200 grit size, P400 grit size, and P800 grit size.

The sintered oxide after the polishing step is preferably cleaned with an air blower or washed with running water and the like. When a foreign substance is to be removed using an air blower, air is preferably sucked with a dust catcher provided at a side opposite a nozzle for effective removal. It should be noted that ultrasonic cleaning may further be performed in view of the limited cleaning power of the air blower and running water. The ultrasonic cleaning is effectively performed with multiple frequencies ranging from 25 kHz to 300 kHz. For instance, twelve waves of different frequencies ranging from 25 kHz to 300 kHz in 25 kHz increments are preferably applied for the ultrasonic cleaning.

Bonding Step

In the bonding step, the sintered body after being ground is bonded to the backing plate using a low-melting-point metal such as indium.

The sputtering target has been described as the above.

Oxide Semiconductor Film

An oxide semiconductor film according to an exemplary embodiment of the invention (sometimes simply referred to as the present semiconductor film) contains In, Ga, and Sn at atomic ratios of:

$$0.01 \leq Ga/(In+Ga+Sn) \leq 0.30 \quad (1)$$

$$0.01 \leq Sn/(In+Ga+Sn) \leq 0.40 \quad (2)$$

$$0.55 \leq In/(In+Ga+Sn) \leq 0.98 \quad (3),$$

and the rare-earth element X at an atomic ratio of:

$$0.03 \leq X/(In+Ga+Sn+X) \leq 0.25 \quad (4).$$

The present semiconductor film is suitably usable for a semiconductor layer (semiconductor portion) of a thin-film transistor.

The present semiconductor film of the above atomic ratio composition can be provided by a sputtering process using the present sputtering target of the same atomic ratio composition.

An atomic ratio composition of a film provided by a sputtering process using a sputtering target made of a sintered oxide becomes the same as the atomic ratio composition of the used sputtering target.

Examples of the suitably usable sputtering process include DC sputtering, RF sputtering, pulse DC sputtering and the like. In a pulse DC sputtering, a film is formed with pulses ranging from 10 kHz to 300 kHz at a duty ratio ranging from 20 to 90%. The output is a function of film-formation speed and is adjustable depending on the desired film-formation speed.

The present semiconductor film of the exemplary embodiment is preferably amorphous when being formed through sputtering, and is preferably kept amorphous after a heat treatment (annealing process). Once an indium oxide crystal is formed, tin is sometimes doped to the indium oxide crystal so that the semiconductor film becomes electrically conductive as in ITO. When the indium oxide crystal is in a form of fine crystals, there are amorphous crystals and the fine crystals simultaneously in the semiconductor film, where carriers may be scattered at interfaces of the amorphous and fine crystals to reduce the carrier mobility. Further, oxygen vacancy or the like, which possibly occurs between the amorphous crystals and the fine crystals, may form a color center of light absorption, impairing optical stability of TFT.

When an oxide semiconductor film whose atomic ratio composition is outside the above range is subjected to a process in a CVD film-formation apparatus used for forming a thin-film transistor, the carrier concentration of the semiconductor portion (the present semiconductor film) of the thin-film transistor is sometimes increased, which is not decreased even after the subsequent annealing, thus failing to function as TFT. Accordingly, the film-formation temperature of the CVD apparatus has been reduced to restrain the increase in the carrier concentration in order to exhibit the TFT performance. However, due to the reduction in the film-formation temperature in the CVD apparatus, the resultant semiconductor film may be poor in durability, and also in the TFT performance.

In the present semiconductor film, gallium oxide is effective in reducing occurrence of oxygen vacancy and increasing the band gap in the oxide semiconductor film. A Ga ratio [Ga/(In+Ga+Sn) (atomic ratio)] is preferably $0.01 \leq Ga/(In+Ga+Sn) \leq 0.30$. When the Ga ratio is less than 0.01, the oxygen vacancy is hardly reduced, thereby sometimes failing to form the semiconductor film. When the Ga ratio is more than 0.30, the resultant film may become an insulation film due to elimination of the oxygen vacancy. More preferably, $0.02 \leq Ga/(In+Ga+Sn) \leq 0.25$, further preferably, $0.03 \leq Ga/(In+Ga+Sn) \leq 0.20$.

In the present semiconductor film, tin oxide is chemically resistant and, as can be understood as a usage in electro-conductive film, is believed to hardly affect the carrier mobility in the semiconductor film. Accordingly, the Sn ratio [Sn/(In+Ga+Sn) (atomic ratio)] is preferably $0.01 \leq Ga/(In+Ga+Sn) \leq 0.40$. When the Sn ratio is less than 0.01, the chemical resistance may not be exhibited. When the Sn ratio is more than 0.40, the chemical resistance may be too high to etch the semiconductor film to form island(s) of the semiconductor film. More preferably, $0.02 \leq Sn/(In+Ga+Sn) \leq 0.35$, further preferably, $0.03 \leq Sn/(In+Ga+Sn) \leq 0.30$.

In the present semiconductor film, indium oxide ensures the carrier mobility in the semiconductor film. The In ratio [In/(In+Ga+Sn) (atomic ratio)] is preferably $0.55 \leq In/(In+Ga+Sn) \leq 0.98$. When the In ratio is less than 0.55, the carrier mobility in the semiconductor film may be lowered. The In ratio of more than 0.98 may cause crystallization or too much oxygen vacancy to form a semiconductor film (i.e. the film may become a conductor). More preferably, $0.60 \leq In/(In+Ga+Sn) \leq 0.96$, further preferably, $0.60 \leq In/(In+Ga+Sn) \leq 0.94$.

In the present semiconductor film, the oxide of the rare-earth element X serves to turn/keep the semiconductor film amorphous, and to reduce carriers from being generated by oxygen vacancy. Unless the amount of the oxide of the rare-earth element X is relatively increased in an oxide semiconductor film with a large fraction of indium oxide in the base material oxide, the semiconductor film may be crystallized, and carrier increase, which is caused due to dopant effect of tin oxide caused by crystallization and the oxygen vacancy in an amorphous state, cannot be restrained. Meanwhile, in an oxide semiconductor film with a small fraction of indium oxide in the base material oxide, unless the amount of the oxide of the rare-earth element X is relatively reduced, the semiconductor film may become insulative and the carrier mobility in the thin-film transistor using the oxide semiconductor film may be decreased. Thus, the ratio of the rare-earth element X should be adjusted depending on the In ratio in the base material oxide.

For instance, at an In ratio [In/(In+Ga+Sn) (atomic ratio)] of 0.85 or more, the ratio of the rare-earth element X [X/(In+Ga+Sn+X) (atomic ratio)] is 0.03 or more, preferably 0.04 or more, more preferably 0.05 or more, and is preferably at most 0.25 or less. At the In ratio [In/(In+Ga+Sn) (atomic ratio)] of 0.85 or more, the semiconductor film may become easily crystallized. In order to restrain the crystallization, the amount of the added rare-earth element X should be preferably increased. The amount of the added rare-earth element X should also be preferably increased in order to restrain the carriers from being generated due to the increase in the oxygen vacancy in the indium oxide in accordance with the increase in the In ratio.

At an In ratio [In/(In+Ga+Sn) (atomic ratio)] of 0.70 or less, the ratio of the added rare-earth element X [X/(In+Ga+Sn+X) (atomic ratio)] is preferably 0.25 or less, more preferably 0.20 or less, further preferably 0.17 or less, and is preferably at least 0.03 or more.

The rare-earth element X has a large ability in restraining the generation of carriers due to oxygen vacancy. For instance, the rare-earth element X has high performance in restoring the carrier concentration of the carriers, which are generated in the semiconductor film when an interlayer insulating film and/or gate insulating film is formed through CVD (Chemical Vapor Deposition) process or the like, to a normal carrier concentration during a subsequent annealing treatment. It has been found that the rare-earth element X with the above-described property allows the carrier concentration, which may be increased once during to the CVD process, to return to a normal level (i.e. for a film to be capable of serving as a semiconductor) during the subsequent annealing, thereby restoring the TFT performance.

At the In ratio [In/(In+Ga+Sn) (atomic ratio)] of the intermediate range (i.e. in a range of more than 0.70 and less than 0.85), film-formation conditions (e.g. oxygen concentration, substrate temperature, film-formation pressure, and back-pressure) should be appropriately adjusted. At the above intermediate range (i.e. more than 0.70 and less than 0.85) of the In ratio [In/(In+Ga+Sn) (atomic ratio)], when the Ga ratio [Ga/(In+Ga+Sn) (atomic ratio)] exceeds 0.10, since amourphizing effect and carrier control effects of the gallium oxide are exhibited, the ratio of the rare-earth element X [X/(In+Ga+Sn+X) (atomic ratio)] is not necessary to be as high as the ratio when the In ratio [In/(In+Ga+Sn) (atomic ratio)] is 0.85 or more. However, in order to provide CVD resistance or the like or further improve the durability of the semiconductor film depending on the usage of the semiconductor film, the amount of the added rare-earth element X may be approximately the same as the amount when the In ratio [In/(In+Ga+Sn) (atomic ratio)] is 0.85 or more.

Meanwhile, when the Sn ratio [Sn/(In+Ga+Sn) (atomic ratio)] exceeds 0.20, the chemical resistance becomes so high that a semiconductor film resistant to etching process and the like can be obtained. The ratio of the rare-earth element X may be appropriately adjusted in view of the CVD resistance and durability of TFT. When the present semiconductor film is used for a thin-film transistor with high carrier mobility, the ratio of the rare-earth element X [X/(In+Ga+Sn+X) (atomic ratio)] when the In ratio [In/(In+Ga+Sn) (atomic ratio)] is 0.85 or less can be reduced. Thus, a thin-film transistor using an oxide semiconductor film with high carrier mobility can be provided.

The added gallium oxide and/or oxide of the rare-earth element X improves the band gap of the oxide semiconductor film, so that an oxide semiconductor film and thin-film transistor (TFT) with high light resistance can be easily provided. The amounts of the gallium oxide and the oxide of the rare-earth element X, which are closely related to the amount of the oxygen vacancy, should be appropriately adjusted in accordance with the required durability depending on the usage of the resultant semiconductor film.

The oxide semiconductor film according to an exemplary embodiment of the invention preferably contains In, Ga and Sn at atomic ratios of:

$$0.02 \leq Ga/(In+Ga+Sn) \leq 0.25 \quad (1A);$$

$$0.02 \leq Sn/(In+Ga+Sn) \leq 0.35 \quad (2A); \text{ and}$$

$$0.60 \leq In/(In+Ga+Sn) \leq 0.96 \quad (3A),$$

and the rare-earth element X at an atomic ratio of:

$$0.03 \leq X/(In+Ga+Sn+X) \leq 0.25 \quad (4A).$$

The oxide semiconductor film according to the exemplary embodiment of the invention more preferably contains In, Ga and Sn at atomic ratios of:

$$0.03 \leq Ga/(In+Ga+Sn) \leq 0.20 \quad (1B);$$

$$0.03 \leq Sn/(In+Ga+Sn) \leq 0.30 \quad (2B); \text{ and}$$

$$0.60 \leq In/(In+Ga+Sn) \leq 0.94 \quad (3B),$$

and the rare-earth element X at an atomic ratio of:

$$0.03 \leq X/(In+Ga+Sn+X) \leq 0.25 \quad (4B).$$

The oxide semiconductor film preferably uses at least one of the rare-earth elements selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), more preferably selected from the group consisting of yttrium (Y), samarium (Sm), and ytterbium (Yb).

The rare-earth element X is further preferably at least one element selected from the group consisting of yttrium (Y), lanthanum (La), neodymium (Nd), and samarium (Sm).

The content (atomic ratio) of each of the metal elements in the oxide semiconductor film can be determined by measuring the amount of the elements through ICP (Inductive Coupled Plasma) measurement or XRF (X-Ray Fluorescence) measurement. An inductively coupled plasma emission spectrometer can be used for the ICP measurement. A thin-film X-ray fluorescence spectrometer (AZX400, manufactured by Rigaku Corporation) can be used for the XRF measurement.

A sector-dynamic SIMS (Secondary Ion Mass Spectrometer) analysis may alternatively be used for analysis of the contents (atomic ratio) of the metal elements in the oxide semiconductor thin-film at the same accuracy as the inductively coupled plasma emission spectrometry. A reference material is prepared by forming source/drain electrodes (made of the same material as in TFT device) of a channel length on an upper surface of a reference oxide thin-film whose atomic ratio of the metal elements are known by measurement using the inductively coupled plasma emission spectrometer or the thin-film X-ray fluorescence spectrometer. Then, the oxide semiconductor layer is analyzed using a sector-dynamic SIMS (Secondary Ion Mass Spectrometer) (IMS 7f-Auto, manufactured by AMETEK, Inc.) to measure a mass spectrum intensity of each of the elements, and plot analytical curves for concentrations of the known elements and the mass spectrum intensity. Next, the atomic ratio in the oxide semiconductor film of an actual TFT device is calculated with reference to the above-described analytical curve based on the spectrum intensity obtained by the sector-dynamic SIMS (Secondary Ion Mass Spectrometry) analysis. As a result of the calculation, it is found that the calculated atomic ratio is within 2 at. % of the atomic ratio of the oxide semiconductor film separately measured by the thin-film X-ray fluorescent spectrometer or the inductively coupled plasma emission spectrometer.

Thin-Film Transistor

A feature of a thin-film transistor according to an aspect of the invention (sometimes referred to as the present TFT hereinafter) is the use of the present oxide semiconductor film.

Though not particularly limited, the thin-film transistor according to the exemplary embodiment of the invention is preferably configured as a back-channel etching transistor, etching stopper transistor, a top-gate transistor or the like.

An amorphous oxide semiconductor film according to an exemplary embodiment of the invention is suitably usable for a channel layer of the thin-film transistor.

The thin-film transistor according to the exemplary embodiment of the invention may be configured in any known manner as long as the thin-film transistor includes the amorphous oxide semiconductor film according to the exemplary embodiment of the invention as the channel layer. The thin-film transistor of the invention is suitably applicable to a display (e.g. liquid crystal display and organic EL display).

A film thickness of the channel layer in the thin-film transistor according to the exemplary embodiment of the invention is typically in a range from 10 to 300 nm, preferably from 20 to 250 nm.

The channel layer in the thin-film transistor according to the exemplary embodiment of the invention, which is usually used to provide an N-type region, is applicable in combination with various P-type semiconductors (e.g. P-type Si semiconductor, P-type oxide semiconductor, P-type organic semiconductor) to various semiconductor devices such as PN junction transistor.

The thin-film transistor according to the exemplary embodiment of the invention is also applicable to various integrated circuits such as a field-effect transistor, logic circuit, memory circuit, and differential amplifier. In addition to the field-effect transistor, the thin-film transistor is applicable to an electrostatic inductive transistor, Schottky barrier transistor, Schottky diode, and resistor.

The thin-film transistor according to an exemplary embodiment of the invention may be constructed in any manner without limitation and may have known structure such as bottom-gate, bottom-contact, and top-contact structures.

Among the above, the bottom-gate structure is advantageous in view of higher performance than thin-film transistors of amorphous silicon and ZnO. The bottom-gate structure is also preferable for the adaptability in reducing the number of masks during the production process, which results in reduction in the production cost of large-size displays and the like.

The thin-film transistor according to the exemplary embodiment of the invention is suitably usable for a display.

Channel-etching bottom-gate thin-film transistors are especially preferable for use in large-size displays. The channel-etching bottom-gate thin-film transistors, which require a small number of photomasks in a photolithography process, allow the production of display panels at a low production cost. Especially, channel-etching bottom-gate and channel-etching top-contact thin-film transistors are preferable in terms of excellent performance (e.g. carrier mobility) and industrial applicability.

Figure 5:
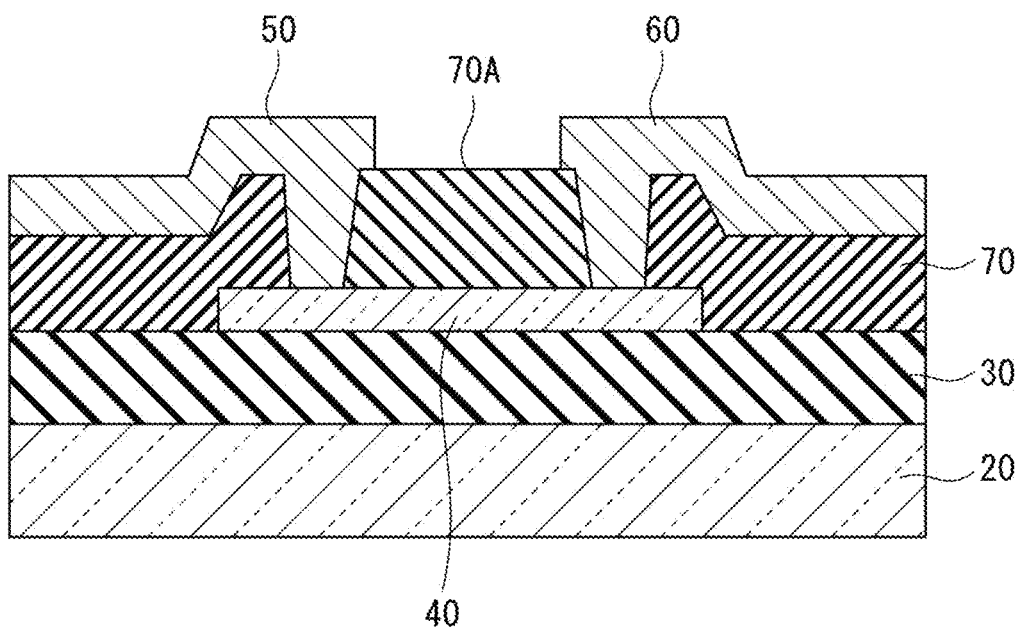
FIG. 5 is a vertical cross section showing a thin-film transistor according to an exemplary embodiment of the invention.
Figure 6:
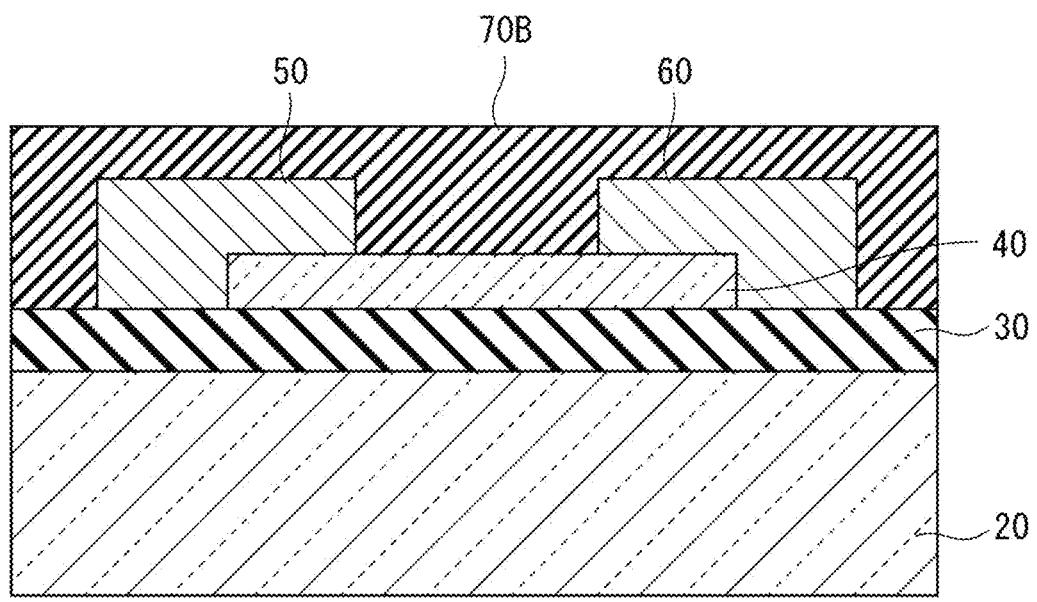
FIG. 6 is a vertical cross section showing another thin-film transistor according to an exemplary embodiment of the invention.

Specific examples of the thin-film transistor are shown in FIGS. 5 and 6.

As shown in FIG. 5, a thin-film transistor 100 includes a silicon wafer 20, a gate insulating film 30, an oxide semiconductor thin-film 40, a source electrode 50, a drain electrode 60, and interlayer insulating films 70, 70A.

The silicon wafer 20 defines a gate electrode. The gate insulating film 30, which is an insulation film for insulation between the gate electrode and the oxide semiconductor thin-film 40, is provided on the silicon wafer 20.

The oxide semiconductor thin-film 40 (channel layer) is provided on the gate insulating film 30. The oxide semiconductor thin-film 40 contains the oxide semiconductor thin-film according to an exemplary embodiment of the invention.

The source electrode 50 and the drain electrode 60, which are conductive terminals for passing source current and drain current through the oxide semiconductor thin-film 40, are in contact with parts near respective ends of the oxide semiconductor thin-film 40.

The interlayer insulating film 70 is an insulation film for insulating parts other than the contact portions between the source electrode 50 (drain electrode 60) and the oxide semiconductor thin-film 40.

The interlayer insulating film 70A is another insulation film for insulating parts other than the contact portions between the source electrode 50 and drain electrode 60, and the oxide semiconductor thin-film 40. The interlayer insulating film 70A is also an insulation film for insulation between the source electrode 50 and the drain electrode 60, and also serves as a protection layer for the channel layer.

As shown in FIG. 5, the structure of a thin-film transistor 100A is substantially the same as the thin-film transistor 100, except that the source electrode 50 and the drain electrode 60 are in contact with both of the gate insulating film 30 and the oxide semiconductor thin-film 40, and that an interlayer insulating film 70B is integrally provided to cover the gate insulating film 30, the oxide semiconductor thin-film 40, the source electrode 50, and the drain electrode 60.

The material for the drain electrode 60, the source electrode 50 and the gate electrode are not particularly limited but may be selected from generally known materials. In the examples shown in FIGS. 5 and 6, the silicon wafer is used for the substrate. Though the silicon wafer also serves as an electrode, the material of the electrode is not necessarily silicon.

For instance, the electrode may be a transparent electrode made of, for instance, Indium Tin Oxide (ITO), Indium Zinc Oxide (IZO), ZnO, and $SnO_2$, a metal electrode made of Al, Ag, Cu, Cr, Ni, Mo, Au, Ti, Ta, or the like, a metal electrode made of an alloy containing the above metal elements, or a laminated electrode of layers made of the alloy.

The gate electrode shown in FIGS. 5 and 6 may be formed on a substrate made of glass or the like.

The material for the interlayer insulating films 70, 70A and 70B is not particularly limited but may be selected as desired from generally known materials. Specifically, the interlayer insulating films 70, 70A, 70B may be made of a compound such as $SiO_2$, $SiNx$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, and AlN.

When the thin-film transistor according to the exemplary embodiment of the invention is a back-channel-etching (bottom-gate) thin-film transistor, it is preferable to provide a protection film on the drain electrode, the source electrode and the channel layer. The protection film enhances the durability against a long-term driving of the TFT. In a top-gate TFT, the gate insulating film is formed on, for instance, the channel layer.

The protection film or the insulation film can be formed, for instance, through a CVD process, which sometimes entails high-temperature treatment. The protection film or the insulation film often contains impurity gas immediately after being formed, and thus preferably subjected to a heat treatment (annealing). The heat treatment removes the impurity gas to provide a stable protection film or insulation film, and, consequently, highly durable TFT device.

With the use of the oxide semiconductor thin-film according to the exemplary embodiment of the invention, the TFT device is less likely to be affected by the temperature in the CVD process and the subsequent heat treatment. Accordingly, the stability of the TFT performance can be enhanced even when the protection film or the insulation film is formed.

Among the transistor performance, On/Off characteristics determine display performance of display devices. When the transistor is used as a switching device of liquid crystal, On/Off ratio is preferably six or more digits. OLED, which is current-driven and whose On-current is of importance, also preferably has six or more digits On/Off ratio.

The thin-film transistor according to the exemplary embodiment of the invention preferably has $1 \times 10^6$ or more On/Off ratio.

The On/Off ratio can be determined as a ratio [On current value/Off current value] of On current value (a value of Id when Vg=20 V) to Off current value (a value of Id when Vg=−10 V).

The carrier mobility in the TFT according to the exemplary embodiment of the invention is preferably 5 $cm^2$/Vs or more, more preferably 10 $cm^2$/Vs or more.

The saturation mobility is determined based on a transfer function when a 20 V drain voltage is applied. Specifically, the saturation mobility can be calculated by: plotting a graph of a transfer function Id–Vg; calculating transconductance (Gm) for each Vg; and calculating the saturation mobility using a formula in a saturated region. It should be noted Id represents a current between the source and drain electrodes, and Vg represents a gate voltage when the voltage Vd is applied between the source and drain electrodes.

A threshold voltage (Vth) is preferably in a range from −3.0 V to 3.0 V, more preferably from −2.0 V to 2.0 V, further preferably from −1.0 V to 1.0 V. At the threshold voltage (Vth) of −3.0 V or more, a thin-film transistor with high carrier mobility can be provided. At the threshold voltage (Vth) of 3.0 V or less, a thin-film transistor with small off current and large On/Off ratio can be provided.

The threshold voltage (Vth) is defined as Vg at Id=$10^{-9}$ A based on the graph of the transfer function.

The On/Off ratio is preferably in a range from $10^6$ to $10^{12}$, more preferably from $-10^7$ to $10^{11}$, further preferably from $10^8$ to $10^{10}$. At the On/Off ratio of $10^6$ or more, a liquid crystal display can be driven. At the On/Off ratio of $10^{12}$ or less, an organic EL device with a large contrast can be driven. Further, the off current can be set at $10^{-11}$ A or less, allowing an increase in image-holding time and improvement in sensitivity when the present transistor is used for a transfer transistor or a reset transistor of a CMOS image sensor.

Quantum-Tunneling Field-Effect Transistor

The oxide semiconductor thin-film according to the exemplary embodiment of the invention is usable for a quantum-tunneling Field-Effect Transistor (FET).

Figure 7:
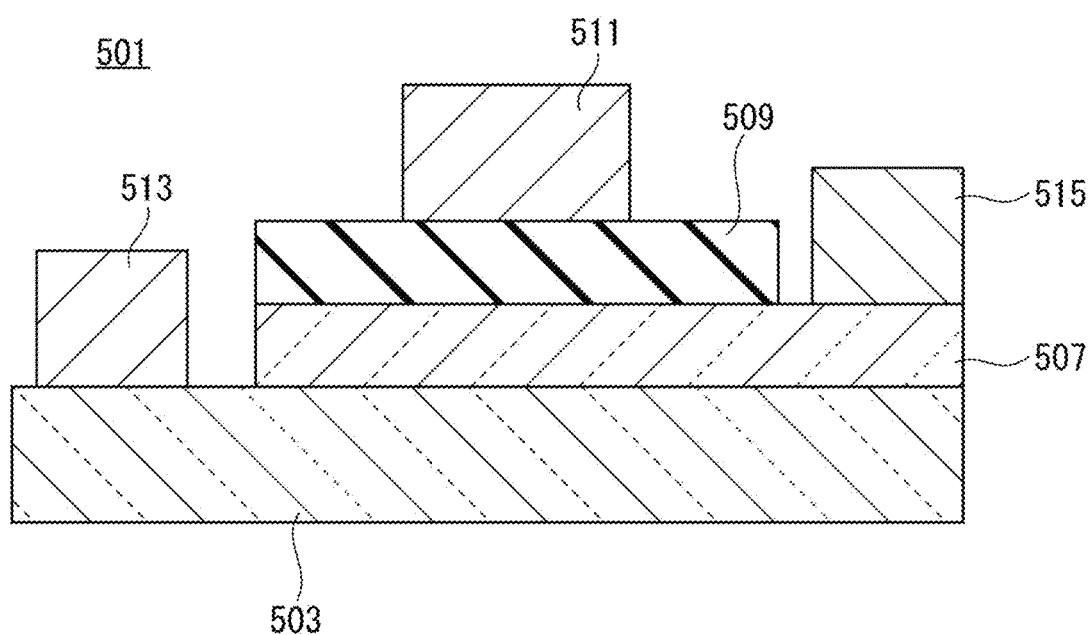
FIG. 7 is a vertical cross section showing a quantum-tunneling field-effect transistor according to an exemplary embodiment of the invention.

FIG. 7 is a schematic illustration (vertical cross section) of a quantum-tunneling FET (Field-Effect Transistor) according to an exemplary embodiment.

A quantum-tunneling field-effect transistor 501 includes a p-type semiconductor layer 503, an n-type semiconductor layer 507, a gate insulating film 509, a gate electrode 511, a source electrode 513, and a drain electrode 515.

The p-type semiconductor layer 503, the n-type semiconductor layer 507, the gate insulating film 509, and the gate electrode 511 are layered in this order.

The source electrode 513 is provided on the p-type semiconductor layer 503. The drain electrode 515 is provided on the n-type semiconductor layer 507.

The p-type semiconductor layer 503 is a layer of a p-type IV group semiconductor layer, which is a p-type silicon layer in the exemplary embodiment.

The n-type semiconductor layer 507 is an n-type oxide semiconductor thin-film used in an image sensor according to the exemplary embodiment. The source electrode 513 and the drain electrode 515 are conductive films.

Though not shown in FIG. 7, an insulation layer may be provided on the p-type semiconductor layer 503. In this case, the p-type semiconductor layer 503 and the n-type semiconductor layer 507 are connected through a contact hole(s) defined by partially removing the insulation layer. Though not shown in FIG. 7, the quantum-tunneling field-effect transistor 501 may be provided with an interlayer insulating film covering an upper side of the quantum-tunneling field-effect transistor 501.

The quantum-tunneling field-effect transistor 501 is a current-switching quantum-tunneling Field-Effect Transistor (FET) for controlling the electric current tunneled through an energy barrier formed by the p-type semiconductor layer 503 and the n-type semiconductor layer 507 using a voltage applied to the gate electrode 511. With this structure, the band gap of the oxide semiconductor of the n-type semiconductor layer 507 can be increased, thereby decreasing the off current.

Figure 8:
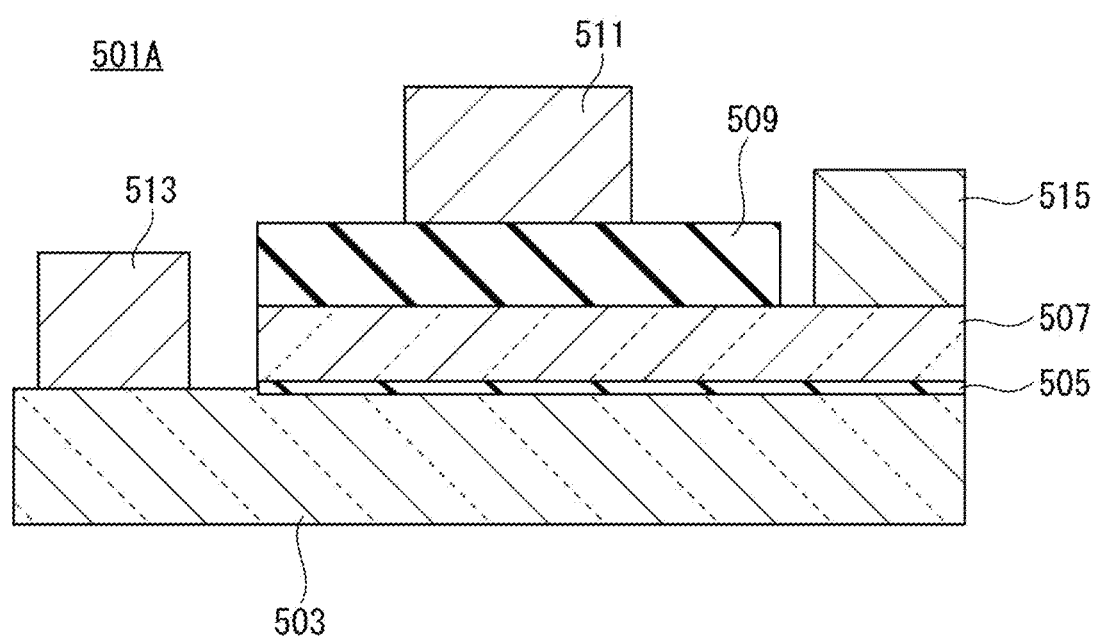
FIG. 8 is a vertical cross section showing a quantum-tunneling field-effect transistor according to an exemplary embodiment of the invention.

FIG. 8 is a schematic illustration (vertical cross section) of a quantum-tunneling field-effect transistor 501A according to another exemplary embodiment.

The structure of the quantum-tunneling field-effect transistor 501A is the same as the structure of the quantum-tunneling field-effect transistor 501 except that a silicon oxide layer 505 is interposed between the p-type semiconductor layer 503 and the n-type semiconductor layer 507. The off current can be reduced by the presence of the silicon oxide layer.

The thickness of the silicon oxide layer 505 is preferably 10 nm or less. At the thickness of 10 nm or less, the tunnel current securely passes through the energy barrier and the energy barrier can be securely formed with a constant barrier height, preventing the decrease or change in the tunneling current. The thickness is preferably 8 nm or less, more preferably 5 nm or less, further preferably 3 nm or less, and especially preferably 1 nm or less.

Figure 9:
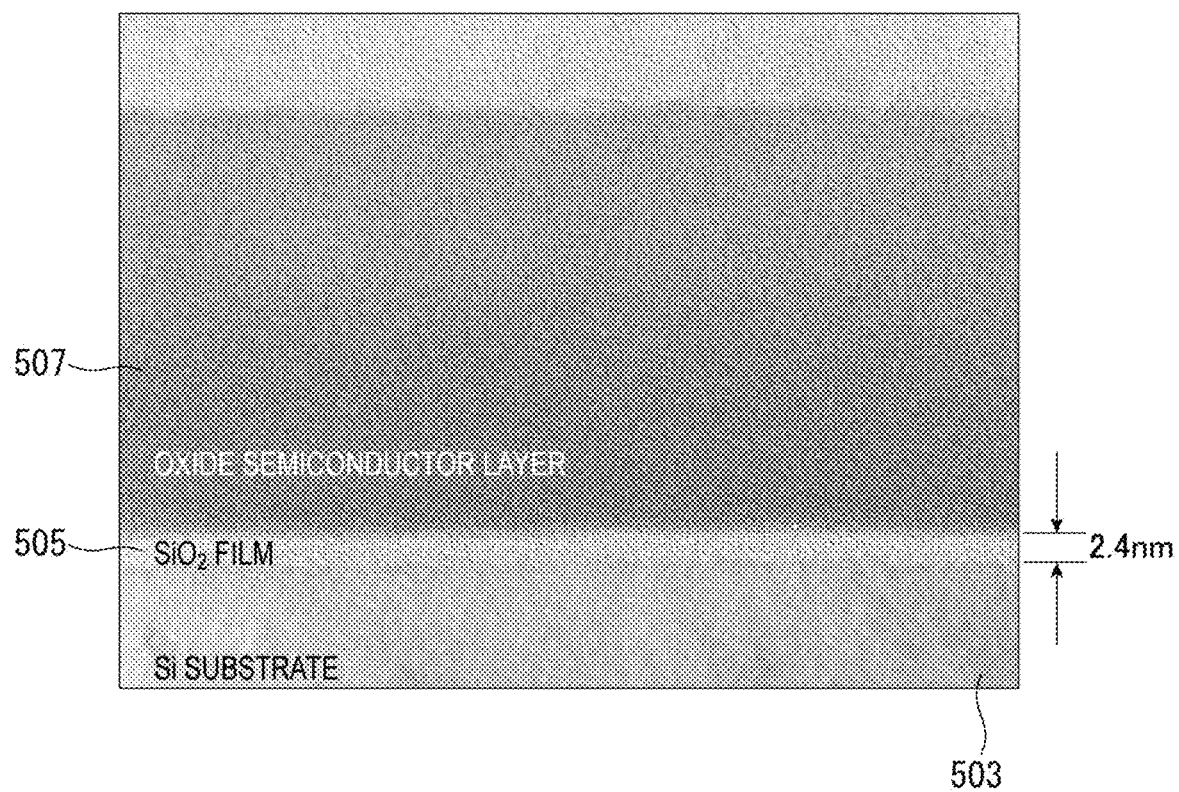
FIG. 9 is a photograph taken by a TEM (Transmission Electron Microscope) showing a silicon oxide layer between a p-type semiconductor layer and an n-type semiconductor layer shown in FIG. 8.

FIG. 9 is a TEM photograph showing the silicon oxide layer 505 between the p-type semiconductor layer 503 and the n-type semiconductor layer 507.

The n-type semiconductor layer 507 in both of the quantum-tunneling field-effect transistors 501 and 501A is an n-type oxide semiconductor.

The oxide semiconductor of the n-type semiconductor layer 507 may be amorphous. The amorphous oxide semiconductor can be etched using an organic acid (e.g. oxalic acid) at a large difference in etching rate from the other layer(s), so that the etching process can be favorably performed without any influence on the metal layer (e.g. wiring).

The oxide semiconductor of the n-type semiconductor layer 507 may alternatively be crystalline. The crystalline oxide semiconductor exhibits a larger band gap than the amorphous oxide semiconductor, so that the off current can be reduced. Further, since the work function can be increased, the control over the current tunneled through the energy barrier formed by the p-type IV group semiconductor material and the n-type semiconductor layer 507 can be facilitated.

A non-limiting example of the production method of the quantum-tunneling field-effect transistor 501 will be described below.

Figure 10:
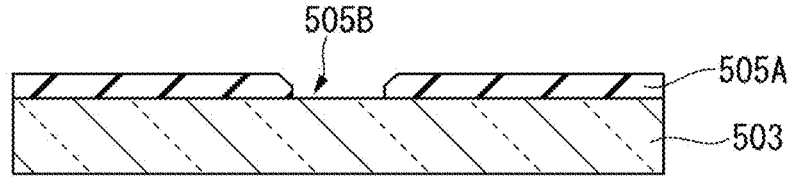
FIG. 10 is a vertical cross section showing a step in a production process of the quantum-tunneling field-effect transistor.

Initially, as shown in FIG. 10, an insulation film 505A is formed on the p-type semiconductor layer 503. Then a part of the insulation film 505A is removed by etching or the like to form a contact hole 505B.

Figure 11:
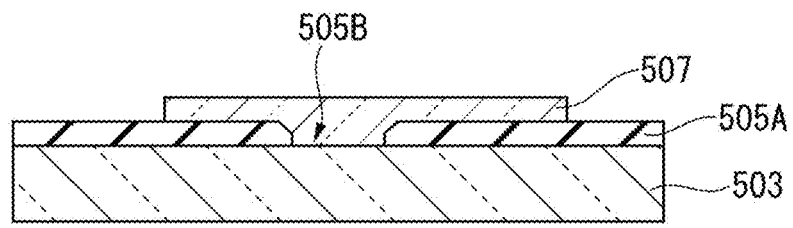
FIG. 11 is a vertical cross section showing another step in the production process of the quantum-tunneling field-effect transistor.

Subsequently, as shown in FIG. 11, the n-type semiconductor layer 507 is formed on the p-type semiconductor layer 503 and the insulation film 505A. At this time, the p-type semiconductor layer 503 and the n-type semiconductor layer 507 are connected through the contact hole 505B.

Figure 12:
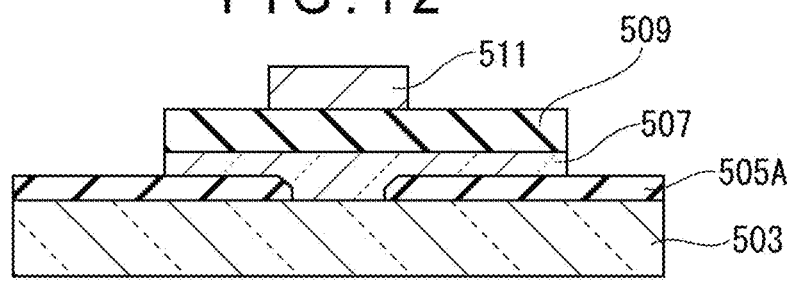
FIG. 12 is a vertical cross section showing still another step in the production process of the quantum-tunneling field-effect transistor.

Subsequently, as shown in FIG. 12, the gate insulating film 509 and the gate electrode 511 are formed in this order on the n-type semiconductor layer 507.

Figure 13:
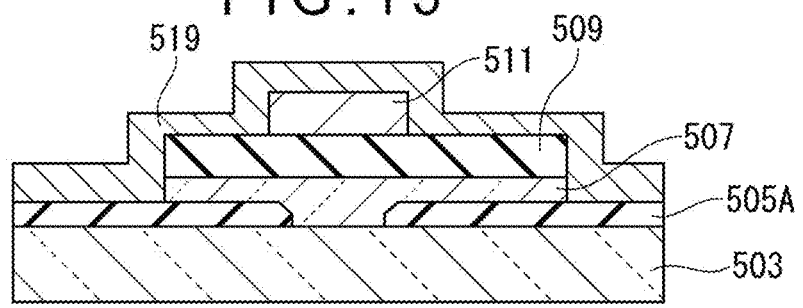
FIG. 13 is a vertical cross section showing a further step in the production process of the quantum-tunneling field-effect transistor.

Then, as shown in FIG. 13, an interlayer insulating film 519 is formed to cover the insulation film 505A, the n-type semiconductor layer 507, the gate insulating film 509 and the gate electrode 511.

Figure 14:
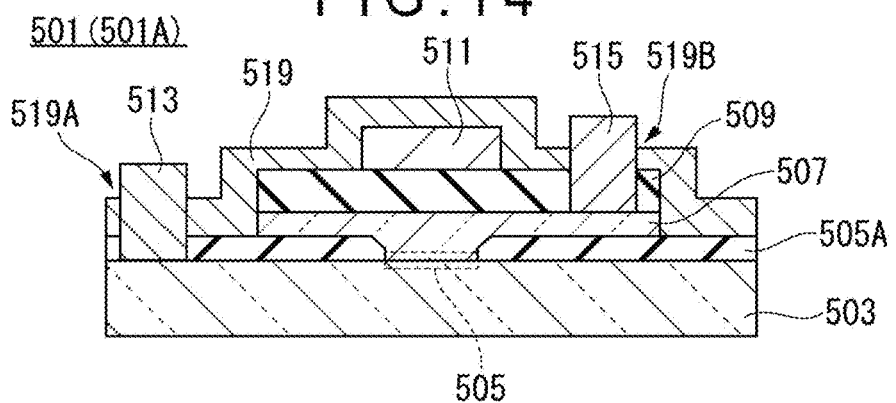
FIG. 14 is a vertical cross section showing a still further step in the production process of the quantum-tunneling field-effect transistor.

Next, as shown in FIG. 14, the insulation film 505A on the p-type semiconductor layer 503 and the interlayer insulating film 519 are partially removed to form a contact hole 519A, in which the source electrode 513 is provided.

Further, as shown in FIG. 14, the gate insulating film 509 on the n-type semiconductor layer 507 and the interlayer insulating film 519 are partially removed to form a contact hole 519B, in which the drain electrode 515 is formed.

The quantum-tunneling field-effect transistor 501 is produced through the above process.

It should be noted that the silicon oxide layer 505 between the p-type semiconductor layer 503 and the n-type semiconductor layer 507 can be formed by applying a heat treatment at a temperature ranging from 150 degrees C. to 600 degrees C. after the n-type semiconductor layer 507 is formed on the p-type semiconductor layer 503. The quantum-tunneling field-effect transistor 501A can be produced through the process including the above additional step.

The thin-film transistor according to the exemplary embodiment of the invention is preferably a doped-channel thin-film transistor. The doped-channel transistor refers to a transistor whose carrier in the channel is appropriately controlled not by the oxygen vacancy, which is easily affected by an external stimuli such as atmosphere and temperature, but by an n-type doping, for achieving both of high carrier mobility and high reliability.

Usage of Thin-Film Transistor

The thin-film transistor according to the exemplary embodiment of the invention is also capable of being embodied as various integrated circuits such as a field-effect transistor, logic circuit, memory circuit, and differential amplifier, which are applicable to electronic devices. Further, the thin-film transistor according to the exemplary embodiment of the invention is also applicable to an electrostatic inductive transistor, Schottky barrier transistor, Schottky diode, and resistor, in addition to the field-effect transistor.

The thin-film transistor according to the exemplary embodiment of the invention is suitably usable for a display, solid-state image sensor, and the like. A display and a solid-state image sensor incorporating the thin-film transistor according to the exemplary embodiment of the invention will be described below.

Initially, a display incorporating the thin-film transistor according to the exemplary embodiment of the invention will be described with reference to FIGS. 15 to 17.

Figure 15:
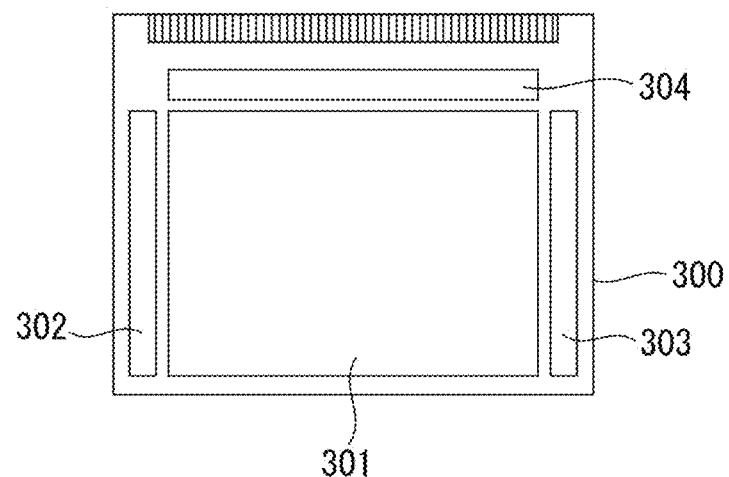
FIG. 15 is a top plan showing a display using the thin-film transistor according to the exemplary embodiment of the invention.

FIG. 15 is a top plan view of a display according to an exemplary embodiment of the invention. FIG. 16 is a circuit diagram showing a circuit of a pixel unit in a form of a liquid crystal device of the display according to the exemplary embodiment of the invention. FIG. 17 is a circuit diagram showing another circuit of a pixel unit in a form of an organic EL device of the display according to the exemplary embodiment of the invention.

The transistor in the pixel unit may be the thin-film transistor according to the exemplary embodiment of the invention. The thin-film transistor according to the exemplary embodiment of the invention is easily made into an n-channel type. Accordingly, a part of the drive circuit capable of being provided by an n-channel transistor is formed on the same substrate as the transistor of the pixel unit. A highly reliable display can be provided using the thin-film transistor of the exemplary embodiment for the pixel unit and/or the drive circuit.

FIG. 15 is a top plan view showing an example of an active matrix display. The display includes a substrate 300, and a pixel unit 301, a first scan line drive circuit 302, a second scan line drive circuit 303, and a signal line drive circuit 304 formed on the substrate 300. Multiple signal lines extend from the signal line drive circuit 304 to the pixel unit 301. Multiple scan lines extend from the first scan line drive circuit 302 and the second scan line drive circuit 303 to the pixel unit 301. Pixels each including a display element are provided in a matrix at intersections of the scan lines and the signal lines. The substrate 300 of the display is connected to a timing controller (controller, also referred to as a control IC) through a connector such as an FPC (Flexible Printed Circuit).

As shown in FIG. 15, the first scan line drive circuit 302, the second scan line drive circuit 303, and the signal line drive circuit 304 are provided on the same substrate 300 as the pixel unit 301. Such an arrangement results in reduction in the number of external component (e.g. drive circuit) and, consequently, reduction in production cost. Further, though wires have to be extended and the number of connections between the wires is increased when the drive circuit is provided outside the substrate 300, the number of connections between the wires can be reduced when the drive circuit is provided on the same substrate 300, so that reliability and/or yield rate can be improved.

Figure 16:
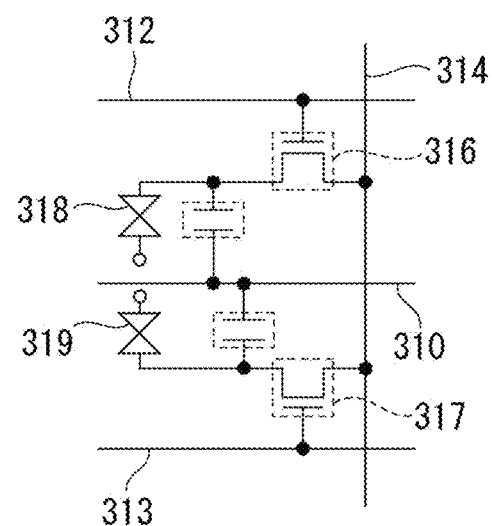
FIG. 16 illustrates a circuit of a pixel unit applicable to a pixel of a VA liquid crystal display.

An example of a pixel circuit is shown in FIG. 16. FIG. 16 shows a circuit of a pixel unit applicable to a pixel unit of a VA liquid crystal display.

The circuit of the pixel unit is applicable to a device having a plurality of pixel electrodes in one pixel. The pixel electrodes are each connected to different transistors, whereby each of the transistors is drivable in accordance with a different gate signal. Thus, the signals to be applied to the respective pixel electrodes of a multi-domain structure can be independently controlled.

A gate line 312 of a transistor 316 and a gate line 313 of a transistor 317 are separated so that different gate signals are inputted thereto. In contrast, a source electrode or drain electrode 314 serving as a data line is common to the transistors 316 and 317. The transistors 316 and 317 may be the transistor according to the exemplary embodiment of the invention. A highly reliable liquid crystal display can be thereby provided.

First and second pixel electrodes are electrically connected to the transistors 316 and 317, respectively. The first pixel electrode is separated from the second pixel electrode. Shapes of the first and second pixel electrodes are not particularly limited. For instance, the first pixel electrode may be V-shaped.

Gate electrodes of the transistors 316 and 317 are connected with the gate lines 312 and 313, respectively. Different gate signals can be inputted to the gate lines 312 and 313 so that the transistors 316 and 317 are operated at different timings, thereby controlling orientation of the liquid crystal.

A capacity line 310, a gate insulating film serving as a dielectric, and a capacity electrode electrically connected with the first pixel electrode or the second pixel electrode may be provided to define a holding capacity.

In a multi-domain structure, first and second liquid crystal devices 318 and 319 are provided in one pixel. The first liquid crystal device 318 includes the first pixel electrode, an opposing electrode, and a liquid crystal layer interposed between the first pixel electrode and the opposing electrode. The second liquid crystal device 319 includes the second pixel electrode, an opposing electrode, and a liquid crystal layer interposed between the second pixel electrode and the opposing electrode.

The pixel unit is not necessarily arranged as shown in FIG. 16. The pixel unit shown in FIG. 16 may additionally include a switch, a resistor, a capacitor, an transistor, a sensor, and/or a logic circuit.

Figure 17:
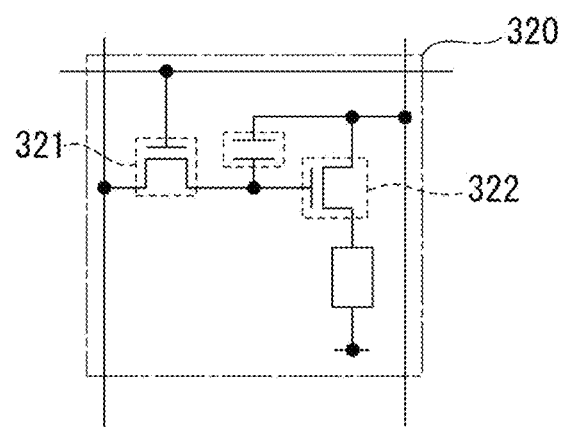
FIG. 17 illustrates a circuit of a pixel unit in a display using an organic EL device.

Another example of a pixel circuit is shown in FIG. 17. Illustrated is a structure of a pixel unit in a display using an organic EL device.

FIG. 17 illustrates an applicable example of a circuit of a pixel unit 320. In this example, two n-channel transistors are used in one pixel. The oxide semiconductor film according to the exemplary embodiment of the invention is usable for a channel-formation region in the n-channel transistor. The circuit of the pixel unit can be driven according to digital pulse width modulation control.

The thin-film transistor according to the exemplary embodiment of the invention is usable for a switching transistor 321 and a drive transistor 322, so that a highly reliable organic EL display can be provided.

The circuit of the pixel unit is not necessarily arranged as shown in FIG. 17. The circuit of the pixel unit shown in FIG. 17 may additionally include a switch, a resistor, a capacitor, a sensor, an transistor, and/or a logic circuit.

The thin-film transistor according to the exemplary embodiment of the invention used in a display has been described above.

Next, a solid-state image sensor incorporating the thin-film transistor according to the exemplary embodiment of the invention will be described with reference to FIG. 18.

CMOS (Complementary Metal Oxide Semiconductor) image sensor is a solid-state image sensor including a signal charge accumulator for holding an electric potential, and an amplification transistor for transferring (outputting) the electric potential to a vertical output line. When the signal charge accumulator is charged or discharged by a possible leak current from the reset transistor and/or the transfer transistor of the CMOS image sensor, the electric potential of the signal charge accumulator changes. The change in the electric potential of the signal charge accumulator results in the change in the electric potential of the amplification transistor (i.e. shift from a desired value), deteriorating the quality of the captured image.

An effect of the thin-film transistor according to the exemplary embodiment of the invention incorporated in the reset transistor and transfer transistor of the CMOS image sensor will be described below. The amplification transistor may be any one of the thin-film transistor or a bulk transistor.

Figure 18:
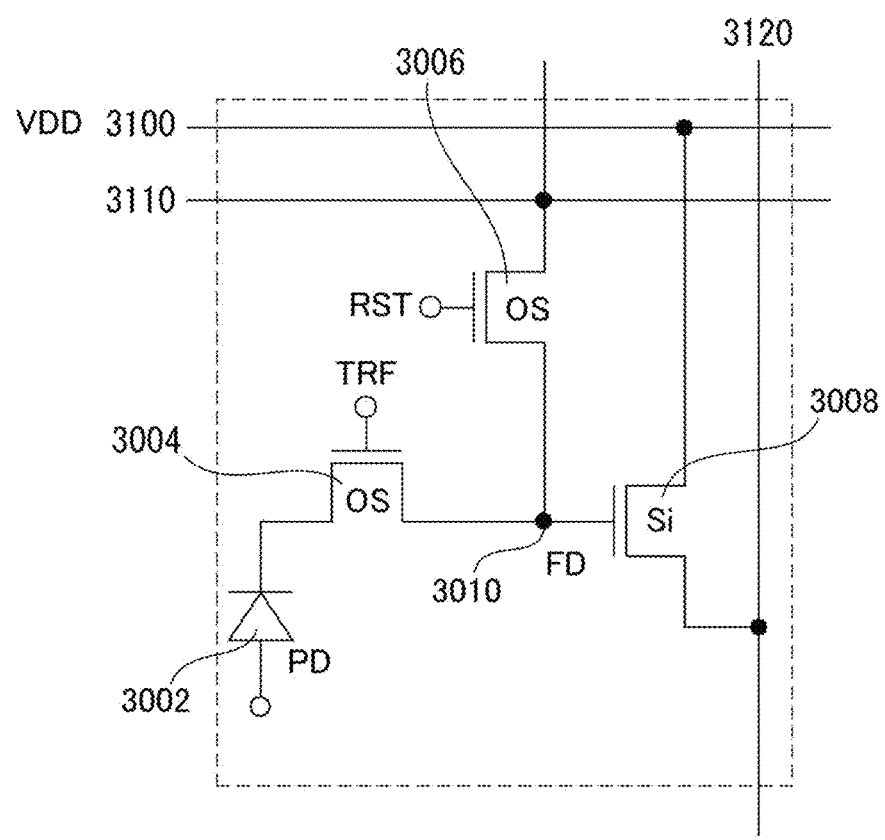
FIG. 18 illustrates a circuit of a pixel unit of a solid-state image sensor using a thin-film transistor according to an exemplary embodiment of the invention.

FIG. 18 illustrates an exemplary arrangement of the CMOS image sensor. The pixel includes a photodiode 3002 (photoelectric converter), a transfer transistor 3004, a reset transistor 3006, an amplification transistor 3008, and various lines. A plurality of the pixels are arranged in a matrix to form the sensor. A selector transistor may be electrically connected to the amplification transistor 3008. The characters in the transistor signs each represent a preferable material to be used for the transistors, where "OS" represents Oxide Semiconductor and "Si" represents silicon. The same applies to the other drawing(s).

The photodiode 3002 is connected to a source of the transfer transistor 3004. A signal charge accumulator 3010 (also referred to as FD (Floating Diffusion)) is provided to a drain of the transfer transistor 3004. The source of the reset transistor 3006 and the gate of the amplification transistor 3008 are connected to the signal charge accumulator 3010. A reset power line 3110 may be omitted in other embodiment. For instance, the drain of the reset transistor 3006 may be connected with a power line 3100 or a vertical output line 3120 instead of the reset power line 3110.

The oxide semiconductor film according to the exemplary embodiment of the invention, which may be made of the same material as the oxide semiconductor film used for the transfer transistor 3004 and the reset transistor 3006, may be used in the photodiode 3002.

The thin-film transistor according to the exemplary embodiment of the invention used in a solid-state image sensor has been described above.

EXAMPLES

The invention will be specifically described below with reference to Examples and Comparatives. It should however be noted that the scope of the invention is by no means limited by the Examples and Comparatives.

Preparation and Property Evaluation of Sintered Oxide

Example 1

Powders of gallium oxide, tin oxide, indium oxide, and oxide of rare-earth element X were weighed in a ratio (atomic ratio) as shown in Table 1, which were put in a polyethylene pot and mixed/pulverized using a dry ball mill for 72 hours to prepare mixture powder.

The mixture powder was put in a die and pressed at a pressure of 49 MPa (500 kg/cm$^2$) to prepare a molding. The molding was compacted through CIP at a pressure of 196 MPa (2000 kg/cm$^2$). Subsequently, after the molding was put into an atmospheric-pressure sintering furnace and was held at 350 degrees C. for three hours, the temperature inside the furnace was raised at a temperature increase rate of 100 degrees C./hr., and the molding was kept at 1450 degrees C. for 32 hours. Then, the molding was left still to be cooled to obtain a sintered oxide.

Property Evaluation of Sintered Oxide

The following physical properties of the obtained sintered oxide were evaluated. The results are shown in Table 1.

(1) Crystalline Phase Observed by XRD

Figure 19:
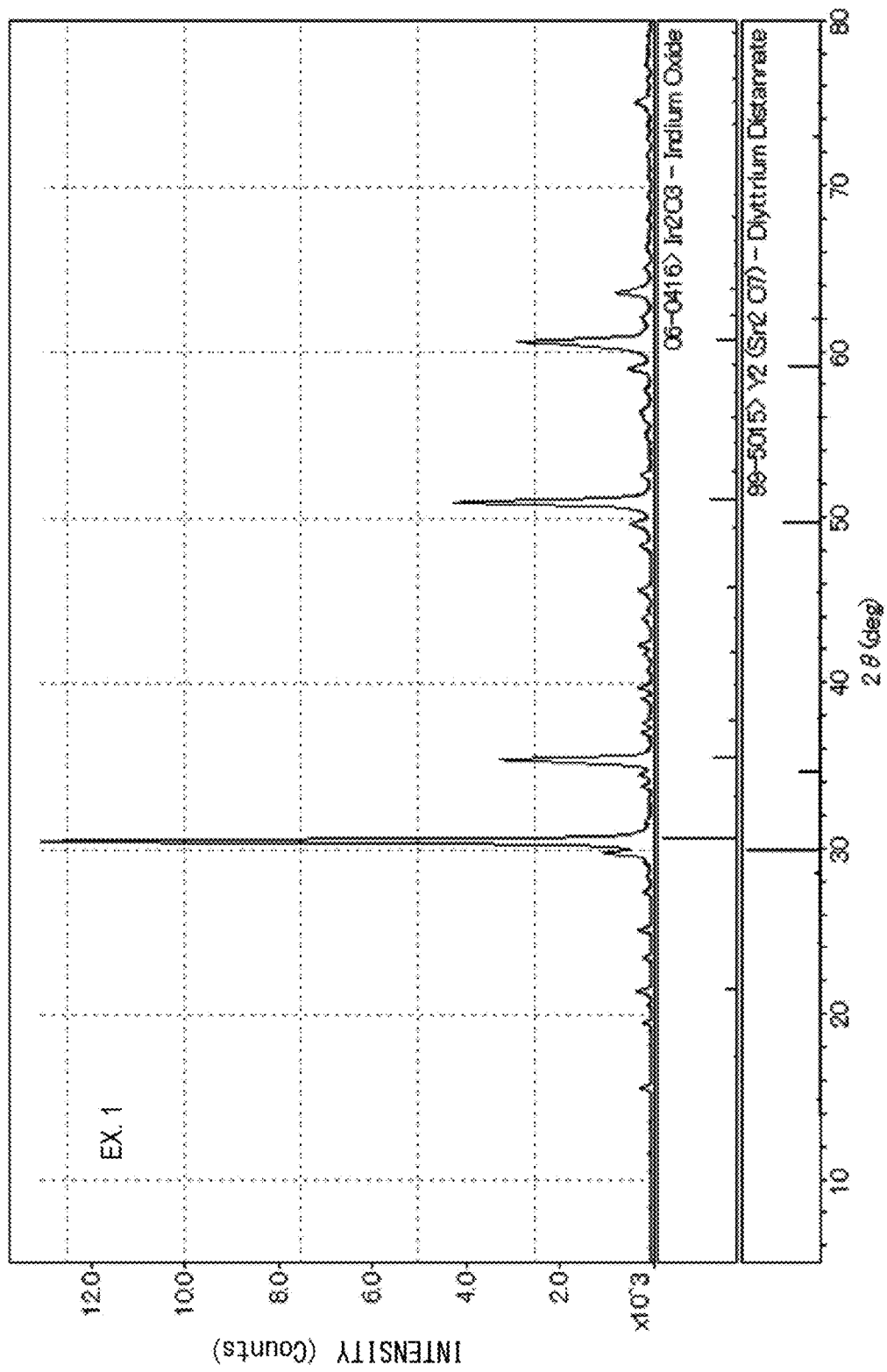
FIG. 19 is an XRD chart of a sintered body prepared in Example 1.
Figure 20:
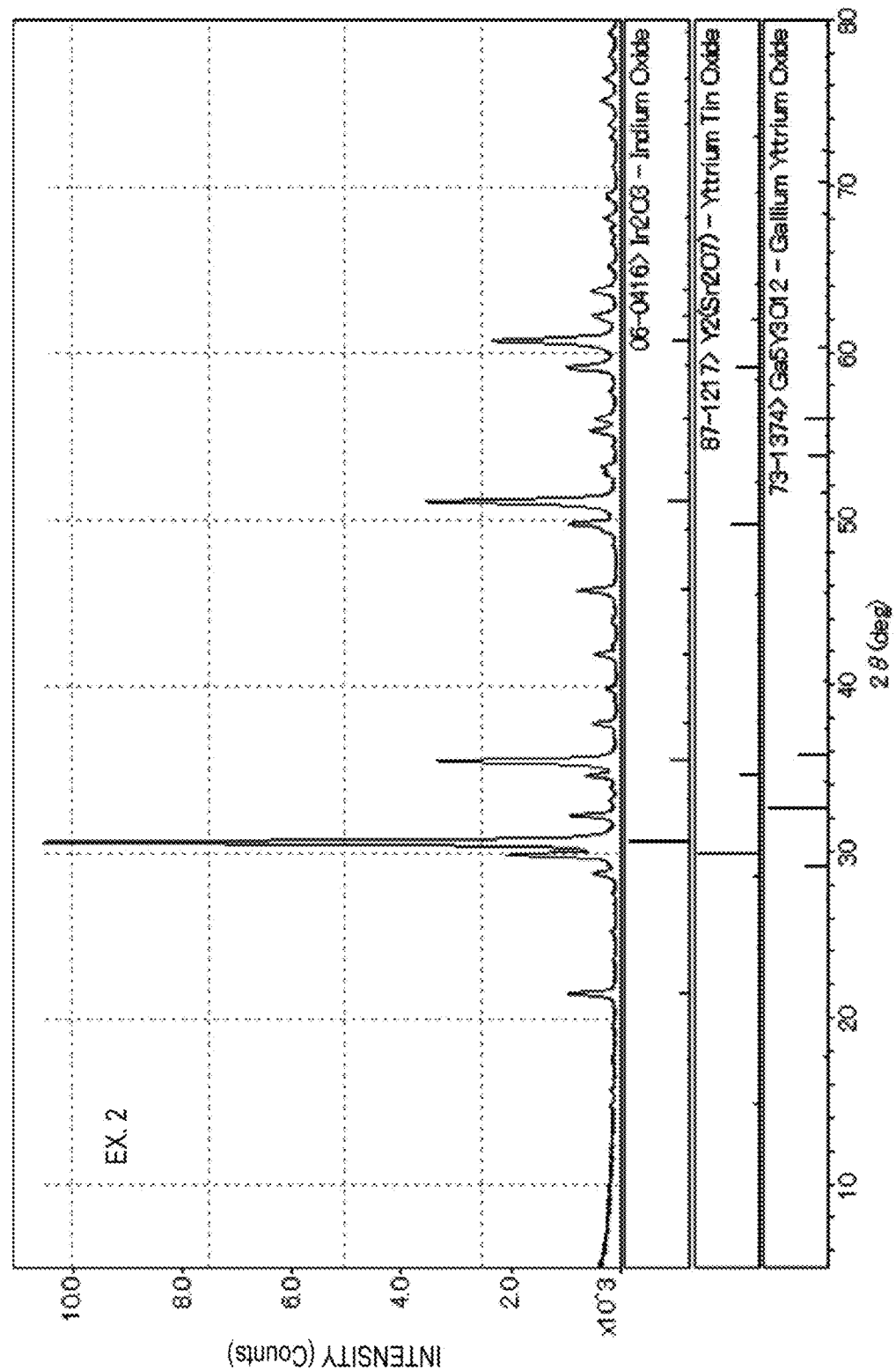
FIG. 20 is an XRD chart of a sintered body prepared in Example 2.
Figure 21:
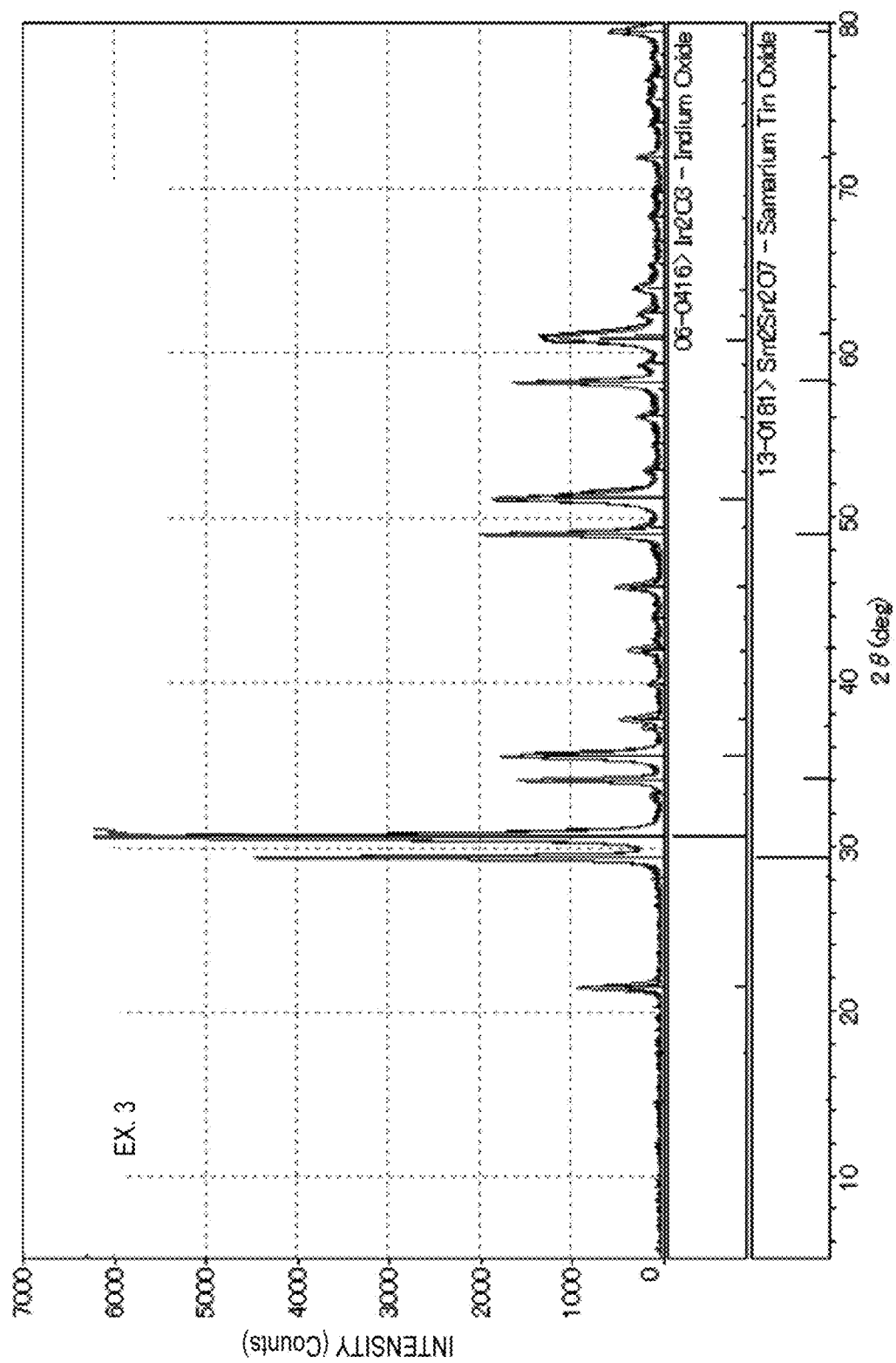
FIG. 21 is an XRD chart of a sintered body prepared in Example 3.
Figure 22:
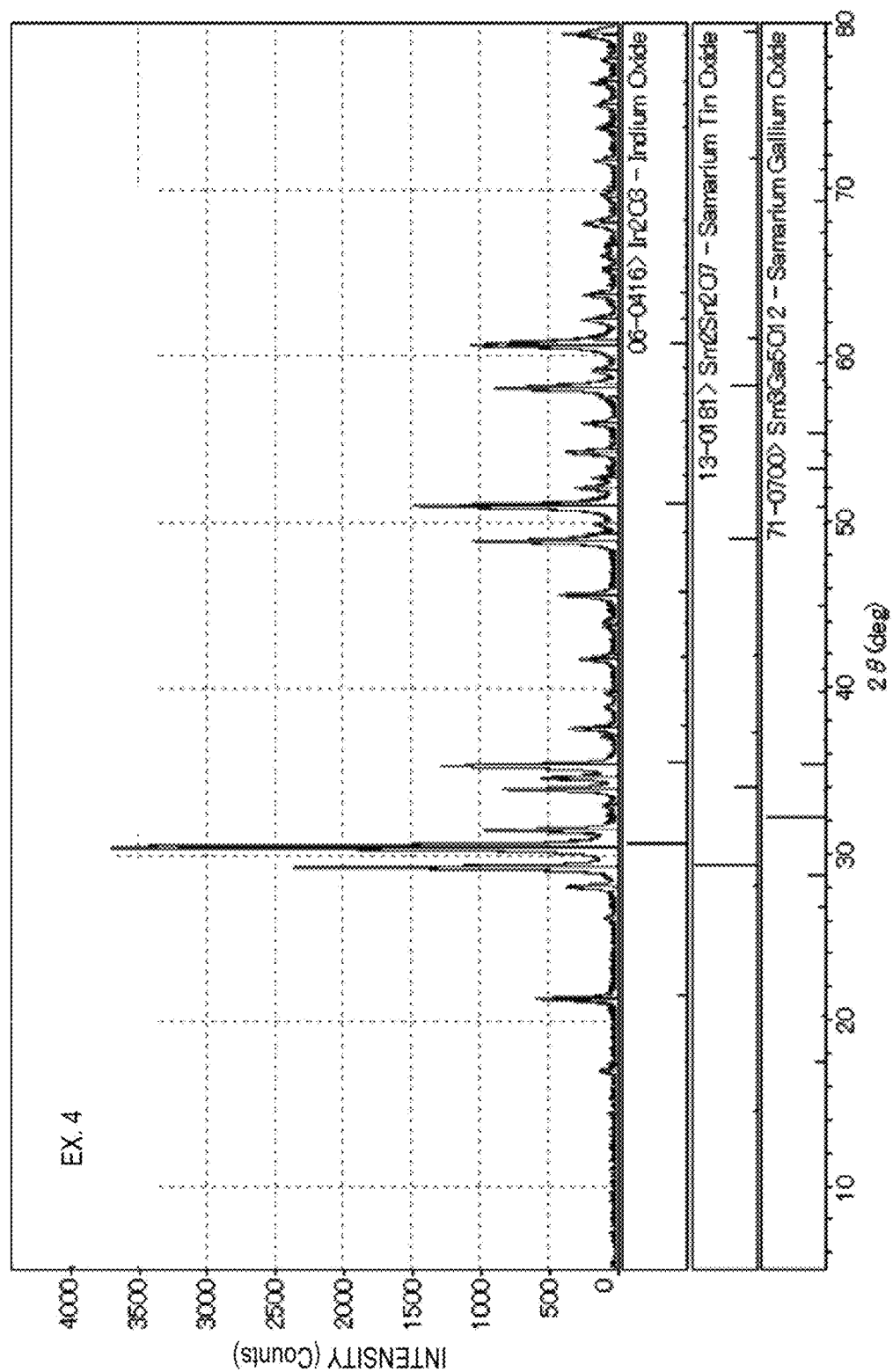
FIG. 22 is an XRD chart of a sintered body prepared in Example 4.
Figure 23:
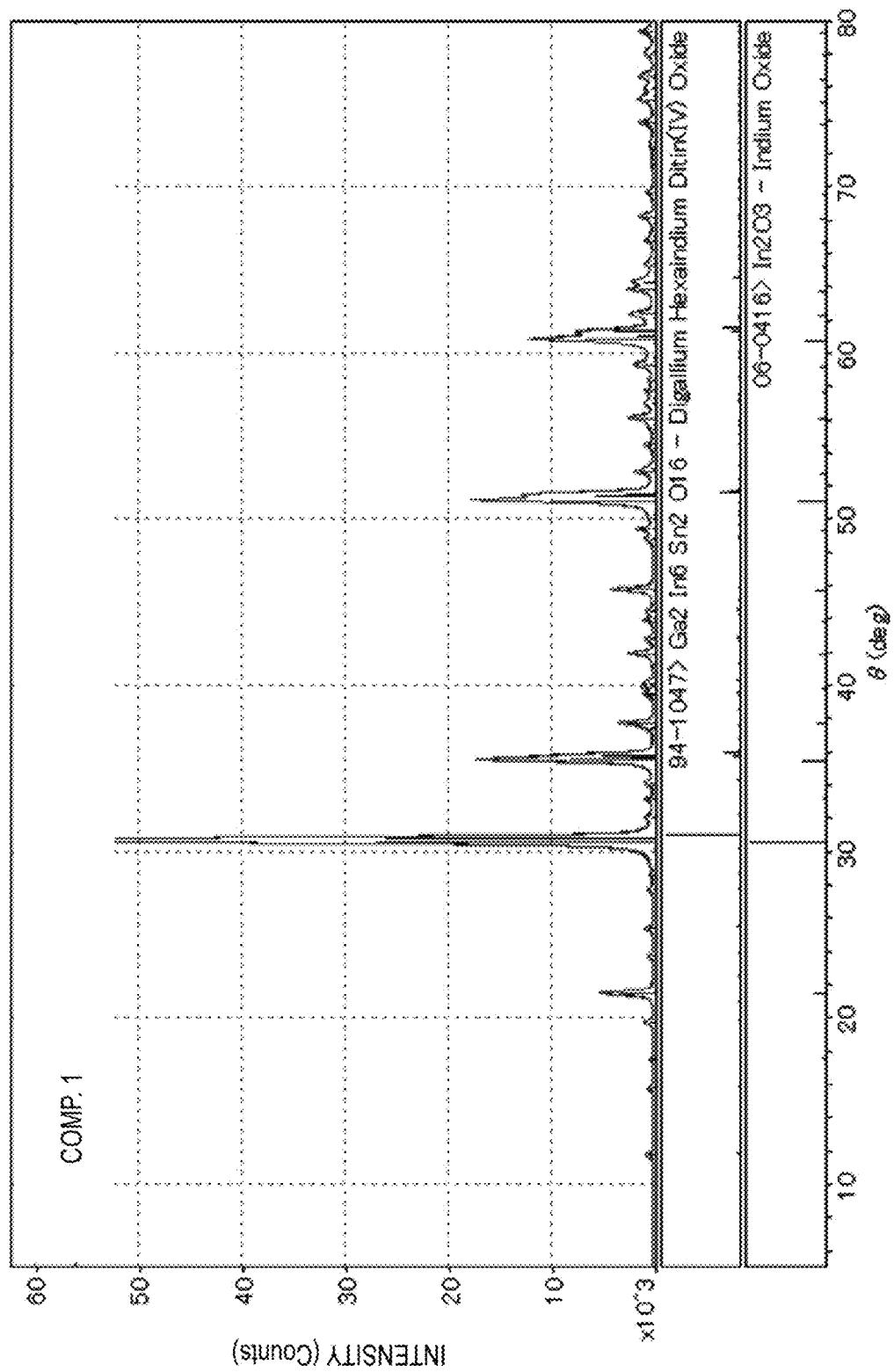
FIG. 23 is an XRD chart of a sintered body prepared in Comparative 1.
Figure 24:
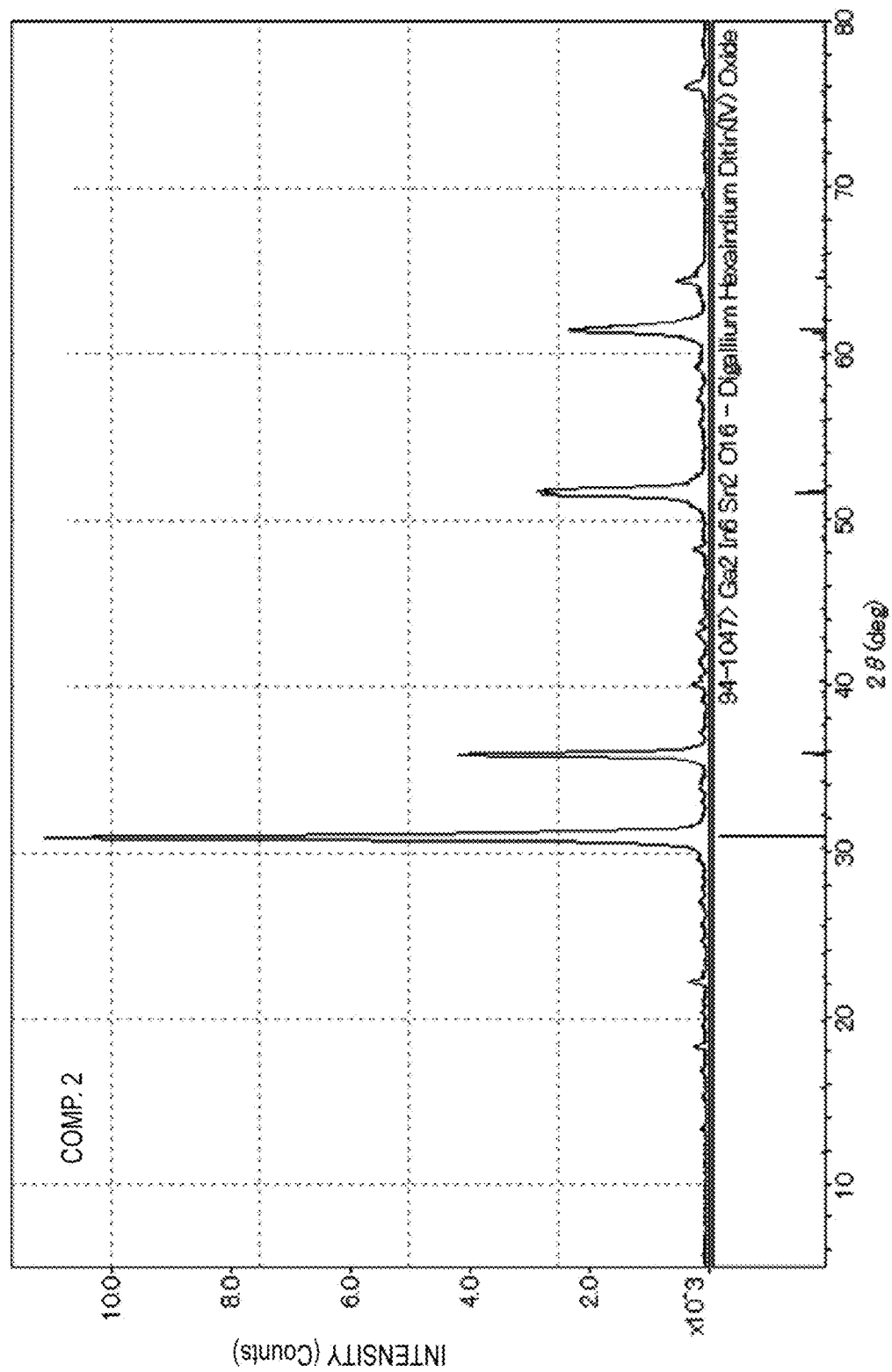
FIG. 24 is an XRD chart of a sintered body prepared in Comparative 2.
Figure 25:
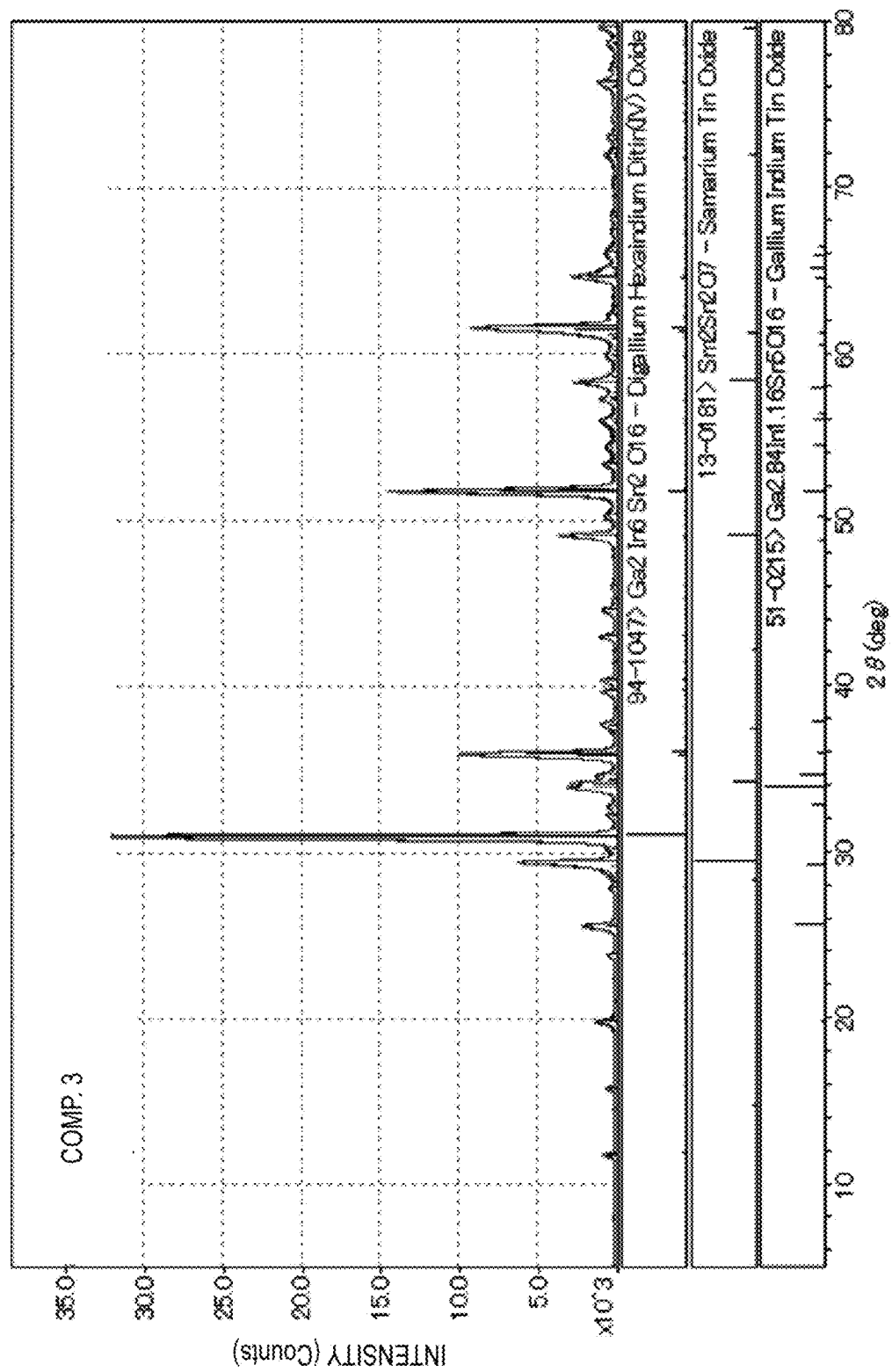
FIG. 25 is an XRD chart of a sintered body prepared in Comparative 3.
Figure 26:
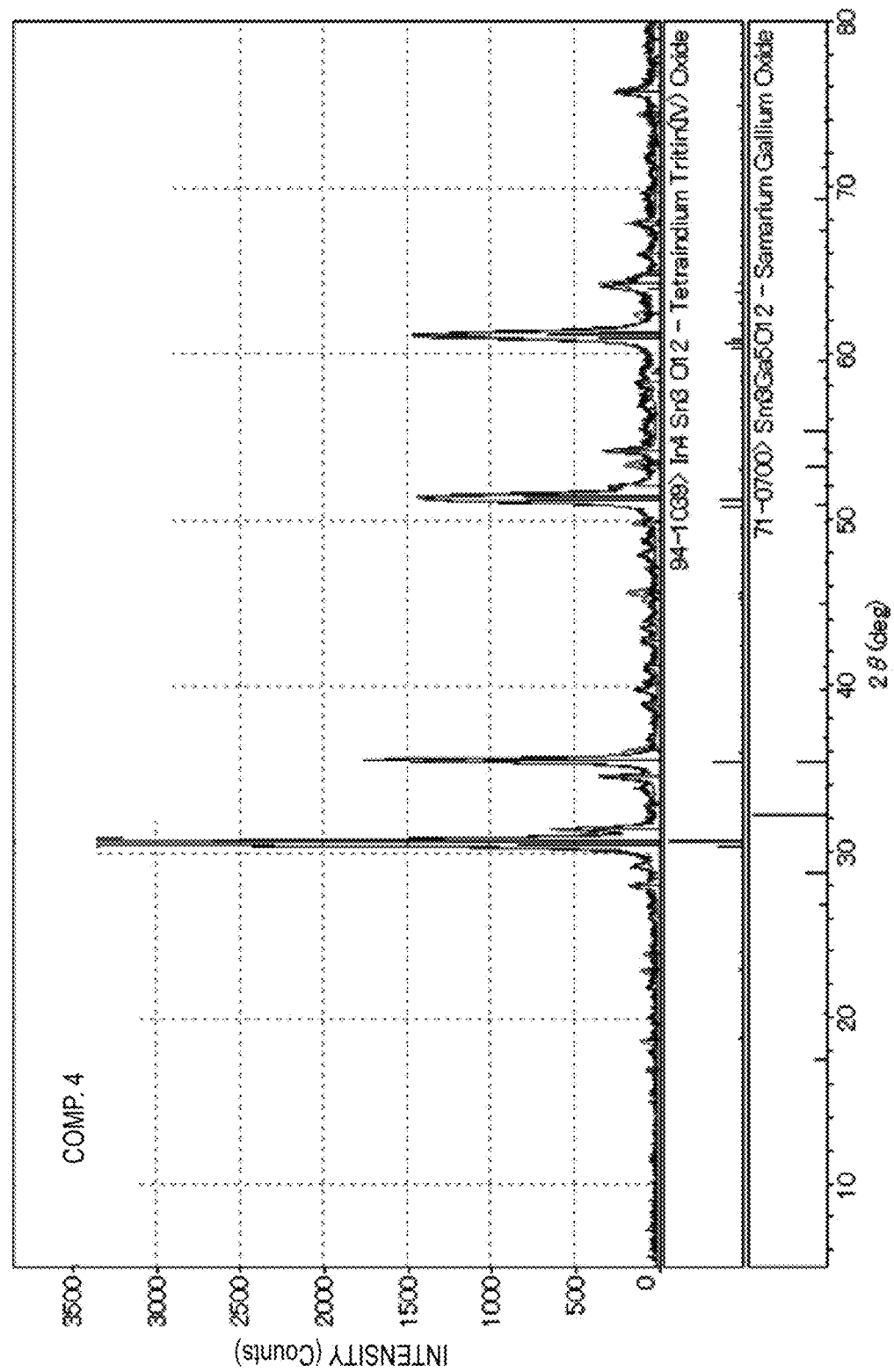
FIG. 26 is an XRD chart of a sintered body prepared in Comparative 4.

X-Ray Diffraction (XRD) of the obtained sintered body was measured using an X-ray diffractiometer Smartlab under the conditions below. The resultant XRD chart was analyzed using JADE6 to determine the crystalline phase in the sintered body. The resultant XRD chart is shown in FIG. 19.

Machine: Smartlab (manufactured by Rigaku Corporation)

X-ray: Cu-Kα ray (wavelength 1.5418×10$^{-10}$ m)

2θ-θ Reflection method, Continuous Scan (2.0 degrees/min.)

Sampling interval: 0.02 degrees

Slit DS (Divergence Slit), SS (Scattering Slit), RS (Receiving Slit): 1 mm (2) Relative Density (%)

The "relative density" herein refers to a value, which is represented by percentage, obtained by dividing an actual density of the sintered oxide, which is measured by Archimedes method, by a theoretical density of the sintered oxide. In the invention, the theoretical density is calculated as follows.

Theoretical density=(total weight of material powder for the sintered oxide)/(total volume of the material powder of the sintered oxide)

For instance, when use amounts (charge amounts) of an oxide A, oxide B, oxide C, and oxide D, which are materials of the material powder of the sintered oxide, are represented by a (g), b (g), c (g), and d (g), respectively, the theoretical density can be calculated according to the formula below.

Theoretical density=(a+b+c+d)/((a/density of oxide A)+(b/density of oxide B)+(c/density of oxide C)+(d/density of oxide D))

It should be noted that the density of each of the oxides in the invention is substantially equal to the specific gravity of each of the oxides. Accordingly, the value of the specific gravity described in "Handbook of Chemistry: Pure Chemistry, Chemical Society of Japan, revised 2nd ed. (MARUZEN-YUSHODO Company, Limited) is used as the value of the density.

(3) Bulk Resistivity (mΩ·cm)

The bulk resistivity (mΩ·cm) of the obtained sintered body was measured according to a four-probe method (JIS R1637) using a resistivity meter Loresta (manufactured by Mitsubishi Chemical Corporation).

(4) State of Target (Sintered Oxide) after Film-Formation at 400 W DC Power for 5 Hrs.

A surface of the target was visually checked after film-formation at DC power 400 W for five hours.

Examples 2 to 4 and Comparatives 1 to 4

Material powders, which were prepared by material oxides of the compositions shown in Table 1, were subjected to the same process as in Example 1 to prepare sintered oxides. The obtained sintered oxides were evaluated in the same manner as in Example 1. The results are shown in Tables 1 and 2. The resultant XRD charts are shown in FIGS. 20 to 26.

TABLE 1

|  |  | Example 1 | Example 2 | Example 3 | Example 4 |
|---|---|---|---|---|---|
|  | Type of Rare-Earth Element X | Y | Y | Sm | Sm |
| Mass % | $Ga_2O_3/(In_2O_3 + Ga_2O_3 + SnO_2 + X_2O_3)$ | 8.0 | 8.0 | 8.0 | 8.0 |
|  | $SnO_2/(In_2O_3 + Ga_2O_3 + SnO_2 + X_2O_3)$ | 20.0 | 12.0 | 20.0 | 12.0 |
|  | $In_2O_3/(In_2O_3 + Ga_2O_3 + SnO_2 + X_2O_3)$ | 60.0 | 68.0 | 54.0 | 60.0 |
|  | $X_2O_3/(In_2O_3 + Ga_2O_3 + SnO_2 + X_2O_3)$ | 12.0 | 12.0 | 18.0 | 20.0 |
| Atomic Ratio | Ga/(In + Ga + Sn) | 0.131 | 0.130 | 0.140 | 0.143 |
|  | Sn/(In + Ga + Sn) | 0.204 | 0.122 | 0.219 | 0.133 |
|  | In/(In + Ga + Sn) | 0.665 | 0.748 | 0.641 | 0.724 |
|  | X/(In + Ga + Sn + X) | 0.141 | 0.140 | 0.145 | 0.161 |
| Crystalline Phase Observed by XRD | | $In_2O_3$ (94.5%) | $In_2O_3$ (77.4%) | $In_2O_3$ (76.6%) | $In_2O_3$ (60.8%) |
| (mass %) | | $Y_2Sn_2O_7$ (5.5%) | $Y_2Sn_2O_7$ (11.1%) | $Sm_2Sn_2O_7$ (23.4%) | $Sm_2Sn_2O_7$ (21.1%) |
|  | | | $Y_3Ga_5O_{12}$ (11.5%) | $Sm_3Ga_5O_{12}$ (≈0%) | $Sm_3Ga_5O_{12}$ (18.1%) |
| Relative Density [%] | | 100.1 | 98.4 | 99.6 | 99.46 |
| Bulk Resistivity [mΩ · cm] | | 16.3 | 8.8 | 1.69 | 0.70 |
| State of Target after Film-Formation at 400 W DC Power for 5 hrs. | | No significant change except for erosion | No significant change except for erosion | No significant change except for erosion | No significant change except for erosion |

TABLE 2

|  |  | Comparative 1 | Comparative 2 | Comparative 3 | Comparative 4 |
|---|---|---|---|---|---|
| Wt % | Type of Rare-Earth Element X | — | Y | Sm | Sm |
|  | $Ga_2O_3/(In_2O_3 + Ga_2O_3 + SnO_2 + X_2O_3)$ | 6.9 | 22.0 | 18.0 | 22.0 |
|  | $SnO_2/(In_2O_3 + Ga_2O_3 + SnO_2 + X_2O_3)$ | 11.1 | 12.0 | 32.0 | 12.0 |
|  | $In_2O_3/(In_2O_3 + Ga_2O_3 + SnO_2 + X_2O_3)$ | 82.0 | 58.0 | 43.0 | 51.0 |
|  | $X_2O_3/(In_2O_3 + Ga_2O_3 + SnO_2 + X_2O_3)$ | — | 8.0 | 7.0 | 15.0 |
| Atomic Ratio | Ga/(In + Ga + Sn) | 0.10 | 0.321 | 0.269 | 0.306 |
|  | Sn/(In + Ga + Sn) | 0.10 | 0.109 | 0.297 | 0.104 |
|  | In/(In + Ga + Sn) | 0.80 | 0.570 | 0.434 | 0.479 |
|  | X/(In + Ga + Sn + X) | — | 0.088 | 0.053 | 0.112 |
|  | Crystalline Phase Observed by XRD (mass %) | $Ga_2In_6Sn_2O_{16}$ (92.7%) $In_2O_3$ (7.3%) | $Ga_2In_6Sn_2O_{16}$ (≈100%) | $Ga_2In_6Sn_2O_{16}$ (81.3%) $Sm_2Sn_2O_7$ (12.4%) $Ga_{2.84}In_{1.16}Sn_5O_{16}$ (6.3%) | $In_4Sn_3O_{12}$ (85.6%) $Sm_3Ga_5O_{12}$ (14.41%) |
|  | Relative Density [%] | 95.7 | 98.39 | — | 96.24 |
|  | Bulk Resistivity [mΩ·cm] | 0.96 | 21.0 | — | 23.2 |
|  | State of Target after Film-Formation at 400 W DC Power for 5 hrs. | Black foreign body and hairline cracks occurred in eroded portion | Black foreign body and hairline cracks occurred in eroded portion | Cracked while producing target | Black foreign body and hairline cracks occurred in eroded portion |

As shown in Table 1, Examples 1 to 4, which contain Ga, Sn, In and rare-earth element X at atomic ratios satisfying the formulae (5) to (8), do not exhibit significant change in appearance except for the formation of erosion. The relative density is 95% or more, and bulk resistivity is 30 mΩ·cm or less.

As shown in Table 2, black foreign body and hairline cracks are caused at an eroded part after film-formation in Comparative 1, which does not contain the rare-earth element X.

Black foreign body and hairline cracks are caused at an eroded part after film-formation in Comparative 2, whose Ga content goes beyond the upper limit in the formula (5).

The sample is cracked during sintering process and the target cannot be produced in Comparative 3, whose In content falls below the lower limit in the formula (7).

Black foreign body and hairline cracks are caused at an eroded part after film-formation in Comparative 4, whose Ga content goes beyond the upper limit in the formula (5) and whose In content falls below the lower limit in the formula (7).

Production and Performance Evaluation of Thin-Film Transistor

Example A (1) Film-Formation Step

A 50 nm thin film (oxide semiconductor layer) was formed on a silicon wafer (gate electrode) coated with a thermally oxidized film (gate insulating film) through a metal mask using a sputtering target produced from the sintered oxide prepared in Example 1 under the film-formation conditions shown in Table 2. Sputtering gas in a form of mixture gas of high-purity argon and 1% high-purity oxygen was used for sputtering.

The thin film (oxide semiconductor layer) was formed using a 4-inch diameter target at 200 kHz, duty ratio 50%, and 200 W output. Later-described physical properties of the obtained semiconductor film were evaluated. The results are shown in Table 3.

(2) Formation of Source/Drain Electrodes

Titanium metal was sputtered through a metal mask to form source/drain electrodes. Then, the resultant layered body was subjected to a heat treatment at 350 degrees C. for 30 minutes. TFT performance of the produced thin-film transistor (TFT) was evaluated.

Performance Evaluation of TFT

The performance of the obtained TFT was evaluated in terms of the following items.

The saturation mobility was determined based on a transfer function when 5 V drain voltage was applied. Specifically, the saturation mobility was calculated by: plotting a graph of a transfer function Id-Vg; calculating transconductance (Gm) for each Vg; and calculating the saturation mobility using a formula in a linear region. It should be noted that Gm is represented by $\partial(Id)/\partial(Vg)$, and the saturation mobility is defined by a maximum carrier mobility in a Vg range from −15 to 25 V. The saturation mobility herein is evaluated according to the above unless otherwise specified. In the above, Id represents a current between source and drain electrodes, and Vg represents a gate voltage when the voltage Vd is applied between the source and drain electrodes.

The threshold voltage (Vth) is defined as Vg at $Id=10^{-9}$ A based on the graph of the transfer function.

The On/Off ratio is determined as a ratio [On/Off] of On current value (a value of Id when Vg=20 V) to Off current value (a value of Id when Vg=−10 V). The results are shown in "TFT performance after heat treatment" in Table 3.

(3) Formation of Protective Insulation Film

An $SiO_2$ film (protective insulation film; interlayer insulating film) was formed on a semiconductor film having been subjected to a heat treatment using chemical vapor deposition (CVD) at a substrate temperature of 300 degrees C., which was subsequently subjected to a further heat treatment (subsequent annealing) at 350 degrees C. for an hour.

The performance of the TFT having been subjected to the heat treatment after forming the $SiO_2$ film was evaluated under the same conditions as in the "TFT performance after heat treatment." The results are shown in "performance of TFT subjected to heat treatment after $SiO_2$ film is formed through CVD" in Table 3.

Property Evaluation of Semiconductor Film

Samples only including an oxide film on a glass substrate were simultaneously prepared. Hall measurement was conducted according to the later-described steps in each of the stages of: after film-formation heat treatment on semiconductor film; and immediately after forming $SiO_2$ film by CVD and after heat treatment of the $SiO_2$ film, to measure and evaluate the property of the semiconductor film (e.g. increase/decrease in carrier density).

It should be noted that the resultant oxide thin films had the same composition in atomic ratio as the used target.

Figure 27:
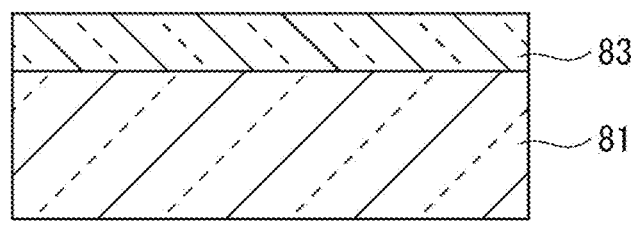
FIG. 27 is a vertical cross section showing an oxide semiconductor thin-film formed on a glass substrate.

Measurement of Hall Effect:

As in TFT production process, a 50-nm-thick oxide semiconductor film was formed on a glass substrate as shown in FIG. 27. After being subjected to a heat treatment, a 1×1 cm square sample piece was cut and gold (Au) was applied on four corners of the sample piece using a metal mask and an ion coater to form a film at a size approximately 2 mm×2 mm or less. Then, indium solder was applied on Au film for enhanced electrical contact, thereby providing a Hall-effect measurement sample.

The glass substrate was made of ABC-G manufactured by Nippon Electric Glass Co., Ltd.

The Hall-effect measurement sample was set to a Hall-effect/specific resistance measurement system (ResiTest 8300, manufactured by TOYO Corporation) to evaluate the Hall effect and determine the carrier density and carrier mobility at a room temperature. The results are shown in "semiconductor film property after heat treatment" in Table 3.

Figure 28:
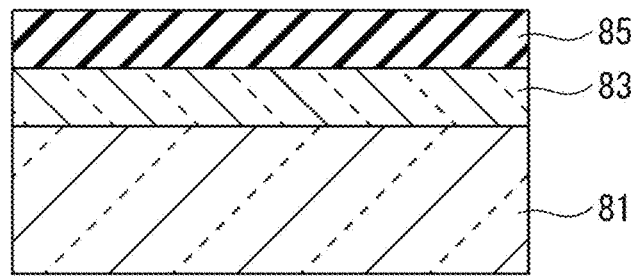
FIG. 28 illustrates an $SiO_2$ film formed on the oxide semiconductor thin-film shown in FIG. 27.

The Hall measurement was conducted under the same conditions as in "semiconductor film property after heat treatment" after forming an $SiO_2$ film using a CVD apparatus on the semiconductor film of the hall-effect measurement sample, as shown in FIG. 28. The results are shown in "semiconductor film property after $SiO_2$ film is formed using CVD" in Table 3.

The Hall measurement was further conducted under the same conditions as in "semiconductor film property after heat treatment" after an additional heat treatment. A measurement probe was stuck into the $SiO_2$ film until reaching Au metal layer for electrical contact. The results are shown in "semiconductor film property after heat treatment after $SiO_2$ film formation using CVD" in Table 3.

Crystal Property of Semiconductor Film:

The results of X-Ray Diffraction (XRD) measurement on crystallinity of a non-heated film after sputtering (after film deposition) and crystallinity of the film after being heated are shown in Table 3.

Band Gap of Semiconductor Film:

Transmission spectrum of a thin-film sample formed on a quartz substrate and subjected to the same heat treatment as in the semiconductor film was measured, whose results were plotted in a graph (abscissa axis: wavelength, ordinate axis; transmittance). Then, after the wavelength in abscissa axis was converted into energy (eV) and the transmittance in ordinate axis was converted into:

$$(\alpha h\nu)^{1/2}$$

where
  α: absorption coefficient,
  h: Planck's constant, and
  ν: oscillation frequency,
a straight line was fitted to a rising portion of the absorption and an eV value at an intersection of the straight line with a base line was calculated.

Example B and Comparative A

The semiconductor film and the thin-film transistor were produced and evaluated in the same manner as in Example A except that the used sputtering target was prepared from the sintered oxide produced by Examples (Comparative) shown in Table 3 and the films were produced under conditions shown in Table 3. The results are shown in Table 3.

TABLE 3

| | | Example A | Example B | Comparative A |
|---|---|---|---|---|
| film-formation conditions of semiconductor film | used sputtering target | Example 1 | Example 2 | Comparative 1 |
| | atmosphere gas | Ar + $O_2$ | Ar + $O_2$ | Ar + $O_2$ |
| | back-pressure before film-formation(Pa) | $5.0 \times 10^{-4}$ | $5.0 \times 10^{-4}$ | $5.0 \times 10^{-4}$ |
| | sputtering pressure in film-formation (Pa) | 0.5 | 0.5 | 0.5 |
| | substrate temperature in film-formation (° C.) | room temperature | room temperature | room temperature |
| | oxygen partial pressure in film-formation (%) | 1 | 1 | 1 |
| heat treatment conditions after forming semiconductor film | heat treatment after film-formation: temperature (° C.) | 350 | 350 | 350 |
| | :temperature increase rate (° C./min.) | 10 | 10 | 10 |
| | :time (min.) | 30 | 30 | 60 |
| | :atmosphere | atmospheric air | atmospheric air | atmospheric air |
| semiconductor film property after heat treatment | Film thickness (nm) | 50 | 50 | 50 |
| | Hall measurement carrier density ($cm^{-3}$) | $2.5 \times 10^{16}$ | $1.2 \times 10^{16}$ | $3.6 \times 10^{19}$ |
| | Hall measurement mobility ($cm^2/V \cdot sec$) | 9.8 | 12.0 | 24.3 |
| | crystallinity immediately after film deposition (XRD) | amorphous | amorphous | amorphous |
| | crystallinity immediately after heating (XRD) | amorphous | amorphous | amorphous |
| | band gap of semiconductor film (eV) | 3.46 | 3.45 | 3.58 |
| TFT performance after heat treatment | saturation mobility ($cm^2/V \cdot sec$) | 12.2 | 7.3 | conductive |
| | Vth (V) | −1.1 | 0.8 | — |
| | on/off ratio | >$10^7$ | >$10^8$ | — |
| | off current (A) | <$10^{-11}$ | <$10^{-12}$ | — |
| semiconductor film property after $SiO_2$ film is formed using CVD | Substrate temperature ° C. | 300 | 300 | 300 |
| | Hall measurement carrier density ($cm^{-3}$) | $2.4 \times 10^{19}$ | $3.6 \times 10^{19}$ | $1.9 \times 10^{20}$ |
| | Hall measurement mobility ($cm^2/V \cdot sec$) | 13.7 | 15.4 | 26.2 |
| semiconductor film property after heat treatment after $SiO_2$ film formation using CVD | heat treatment: temperature (° C.) | 350 | 350 | 350 |
| | :time (min.) | 60 | 60 | 30 |
| | :atmosphere | atmospheric air | atmospheric air | atmospheric air |
| | Hall measurement carrier density ($cm^{-3}$) | $8.8 \times 10^{16}$ | $7.4 \times 10^{13}$ | $7.0 \times 10^{19}$ |
| | Hall measurement mobility ($cm^2/V \cdot sec$) | 19.8 | 26.6 | 25.1 |

TABLE 3-continued

| | | Example A | Example B | Comparative A |
|---|---|---|---|---|
| performance of TFT subjected to heat treatment after SiO$_2$ film is formed through CVD | saturation mobility (cm$^2$/V · sec) | 17.7 | 12.2 | conductive |
| | Vth (V) | −2.4 | 0.2 | — |
| | on/off ratio | >10$^7$ | >10$^8$ | — |
| | off current (A) | <10$^{-11}$ | <10$^{-12}$ | — |

As shown in Table 3, Examples A and B, whose semiconductor films were formed using the sintered bodies of Examples 1 and 2, respectively, exhibit TFT performance after the heat treatment.

The semiconductor film of Comparative A, which was formed using the sintered body of Comparative 1, becomes conductive when heated, failing to exhibit the performance of TFT.

The invention claimed is:

1. An oxide semiconductor film comprising In, Ga, and Sn at respective atomic ratios of:

$$0.01 < Ga/(In+Ga+Sn) < 0.30 \quad (1);$$

$$0.01 < Sn/(In+Ga+Sn) < 0.40 \quad (2);$$

$$0.55 < In/(In+Ga+Sn) < 0.98 \quad (3), \text{ and}$$

a rare-earth element X at an atomic ratio of $$0.04 < X/(In+Ga+Sn+X) < 0.25 \quad (4)$$

wherein the rare-earth element X is at least one rare-earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

2. The oxide semiconductor film according to claim 1, wherein the rare-earth element X is at least one rare-earth element selected from the group consisting of yttrium (Y), lanthanum (La), neodymium (Nd), and samarium (Sm).

3. A thin-film transistor comprising the oxide semiconductor film according to claim 1.

4. A sintered oxide comprising In, Ga, and Sn at respective atomic ratios of:

$$0.01 < Ga/(In+Ga+Sn) < 0.30 \quad (5);$$

$$0.01 < Sn/(In+Ga+Sn) < 0.40 \quad (6); \text{ and}$$

$$0.55 < In/(In+Ga+Sn) < 0.98 \quad (7), \text{ and}$$

a rare-earth element X at an atomic ratio of $$0.04 < X/(In+Ga+Sn+X) < 0.25 \quad (8).$$

5. The sintered oxide according to claim 4, wherein the rare-earth element X is at least one rare-earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

6. The sintered oxide according to claim 5, wherein the rare-earth element X is at least one rare-earth element selected from the group consisting of yttrium (Y), lanthanum (La), neodymium (Nd), and samarium (Sm).

7. The sintered oxide according to claim 4, wherein the sintered oxide comprises a main component in a form of In$_2$O$_3$ crystal, and the sintered oxide further comprises at least one of X$_2$Sn$_2$O$_7$ crystal and X$_3$Ga$_5$O$_{12}$ crystal, X representing the rare-earth element.

8. The sintered oxide according to claim 4, wherein a relative density of the sintered oxide is 95% or more.

9. The sintered oxide according to claim 4, wherein a bulk resistivity of the sintered oxide is 30 mΩ cm or less.

10. A sputtering target comprising: the sintered oxide according to claim 4; and a backing plate.

11. An electronic device comprising the thin-film transistor according to claim 3.

12. A thin-film transistor comprising the oxide semiconductor film according to claim 1.

13. A thin-film transistor comprising the oxide semiconductor film according to claim 2.

14. The sintered oxide according to claim 5, wherein the sintered oxide comprises a main component in a form of In$_2$O$_3$ crystal, and the sintered oxide further comprises at least one of X$_2$Sn$_2$O$_7$ crystal and X$_3$Ga$_5$O$_{12}$ crystal, X representing the rare-earth element.

15. The sintered oxide according to claim 6, wherein the sintered oxide comprises a main component in a form of In$_2$O$_3$ crystal, and the sintered oxide further comprises at least one of X$_2$Sn$_2$O$_7$ crystal and X$_3$Ga$_5$O$_{12}$ crystal, X representing the rare-earth element.

* * * * *